United States Patent
Ooi et al.

(10) Patent No.: US 12,457,903 B2
(45) Date of Patent: Oct. 28, 2025

(54) PIEZOELECTRIC VIBRATION ELEMENT, PIEZOELECTRIC RESONATOR UNIT, AND ELECTRONIC DEVICE

(71) Applicant: Murata Manufacturing Co., Ltd., Nagaokakyo (JP)

(72) Inventors: Yuuki Ooi, Nagaokakyo (JP); Norio Iwashita, Nagaokakyo (JP); Hayato Sasaki, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 832 days.

(21) Appl. No.: 17/749,870

(22) Filed: May 20, 2022

(65) Prior Publication Data

US 2022/0278268 A1 Sep. 1, 2022

Related U.S. Application Data

(63) Continuation of application No. PCT/JP2020/028241, filed on Jul. 21, 2020.

(30) Foreign Application Priority Data

Dec. 27, 2019 (JP) .................................. 2019-238993

(51) Int. Cl.
*H01L 41/047* (2006.01)
*H01L 41/335* (2013.01)
(Continued)

(52) U.S. Cl.
CPC ............ *H10N 30/872* (2023.02); *H03H 9/19* (2013.01); *H10N 30/085* (2023.02); *H10N 30/853* (2023.02)

(58) Field of Classification Search
CPC .. H10N 30/853; H10N 30/085; H10N 30/872; H03H 9/19
(Continued)

(56) References Cited

U.S. PATENT DOCUMENTS

2009/0091904 A1 4/2009 Hatanaka et al.
2013/0043959 A1* 2/2013 Ishii ..................... H03H 9/0542
331/158

FOREIGN PATENT DOCUMENTS

JP 2009188483 A 8/2009
JP 2014007693 A 1/2014
(Continued)

OTHER PUBLICATIONS

Machine translation of JP 2017060054, Takashi et al. Mar. 23, 2017 (Year: 2017).*

(Continued)

*Primary Examiner* — Bumsuk Won
(74) *Attorney, Agent, or Firm* — ArentFox Schiff LLP

(57) ABSTRACT

A piezoelectric vibration element includes a piezoelectric piece having a main surface; an excitation electrode disposed on the main surface of the piezoelectric piece; and a connection electrode disposed on the main surface of the piezoelectric piece and electrically connected to the excitation electrode, wherein when the main surface of the piezoelectric piece is viewed in a plan, the piezoelectric piece has a through-hole in an area between the excitation electrode and the connection electrode, and wherein an internal wall of the through-hole located closer to the excitation electrode has at least four slopes.

19 Claims, 12 Drawing Sheets

(51) Int. Cl.
*H03H 9/19* (2006.01)
*H10N 30/085* (2023.01)
*H10N 30/853* (2023.01)
*H10N 30/87* (2023.01)

(58) Field of Classification Search
USPC .......................................................... 310/365
See application file for complete search history.

(56) References Cited

FOREIGN PATENT DOCUMENTS

| WO | 2007114224 A1 | 10/2007 |
|---|---|---|
| WO | 2016111037 A1 | 7/2016 |

OTHER PUBLICATIONS

International Search Report in PCT/JP2020/028241, mailed Aug. 25, 2020, 2 pages.

* cited by examiner

PIEZOELECTRIC VIBRATION ELEMENT, PIEZOELECTRIC RESONATOR UNIT, AND ELECTRONIC DEVICE

CROSS REFERENCE TO RELATED APPLICATIONS

This application is a continuation of PCT Application No. PCT/JP2020/028241, filed Jul. 21, 2020, which claims priority to Japanese Patent Application No. 2019-238993, filed Dec. 27, 2019, the entire contents of each of which are hereby incorporated in their entirety.

TECHNICAL FIELD

Aspects of the present disclosure are directed to a piezoelectric vibration element, a piezoelectric resonator unit, and an electronic device.

BACKGROUND OF THE INVENTION

Vibrators are used as, for example, a timing device, a sensor, or an oscillator in various electronic devices such as a mobile communication terminal, a communication base station, or a household electrical appliance. With an increase in functionality of electronic devices, small and thin piezoelectric vibration elements have been demanded.

For example, Japanese Unexamined Patent Application Publication No. 2009-188483 ("JP '483") discloses a piezoelectric vibration element that can reduce unwanted vibrations attributable to a higher-order contour mode with a through-hole formed in a piezoelectric substrate for height reduction.

The shape of the through-hole affects, for example, a vibration energy confinement effect. However, JP '483 neither describes the shape of the through-hole, nor clarifies a preferable shape of the through-hole.

The present invention has been made in view of such circumstances, and aims to provide a piezoelectric vibration element, a piezoelectric resonator unit, and an electronic device with reduced equivalent series resistance (ESR).

SUMMARY OF THE INVENTION

Accordingly, it is an object of the present disclosure to provide a piezoelectric vibration element which includes a piezoelectric piece having a main surface, an excitation electrode disposed on the main surface of the piezoelectric piece, and a connection electrode disposed on the main surface of the piezoelectric piece and electrically connected to the excitation electrode. When the main surface of the piezoelectric piece is viewed in a plan, the piezoelectric piece has a through-hole in an area between the excitation electrode and the connection electrode, and an internal wall of the through-hole located closer to the excitation electrode has at least four slopes.

Accordingly, it is an object of the present disclosure to provide a piezoelectric vibration element which includes a piezoelectric piece having a main surface, an excitation electrode disposed on the main surface of the piezoelectric piece, and a connection electrode disposed on the main surface of the piezoelectric piece and electrically connected to the excitation electrode. When the main surface of the piezoelectric piece is viewed in a plan, the piezoelectric piece has a through-hole in an area between the excitation electrode and the connection electrode. An internal wall of the through-hole located closer to the excitation electrode protrudes further than an internal wall of the through-hole located closer to the connection electrode.

Accordingly the present disclosure provides a piezoelectric vibration element, a piezoelectric resonator unit, and an electronic device with reduced ESR.

Additional advantages and novel features of the system of the present disclosure will be set forth in part in the description that follows, and in part will become more apparent to those skilled in the art upon examination of the following or upon learning by practice of the disclosure

BRIEF DESCRIPTION OF THE DRAWINGS

In the descriptions that follow, like parts are marked throughout the specification and drawings with the same numerals, respectively. The drawings are not necessarily drawn to scale and certain drawings may be shown in exaggerated or generalized form in the interest of clarity and conciseness. The disclosure itself, however, as well as a mode of use, further features and advances thereof, will be understood by reference to the following detailed description of illustrative implementations of the disclosure when read in conjunction with reference to the accompanying drawings.

DETAILED DESCRIPTION

Figure 1:
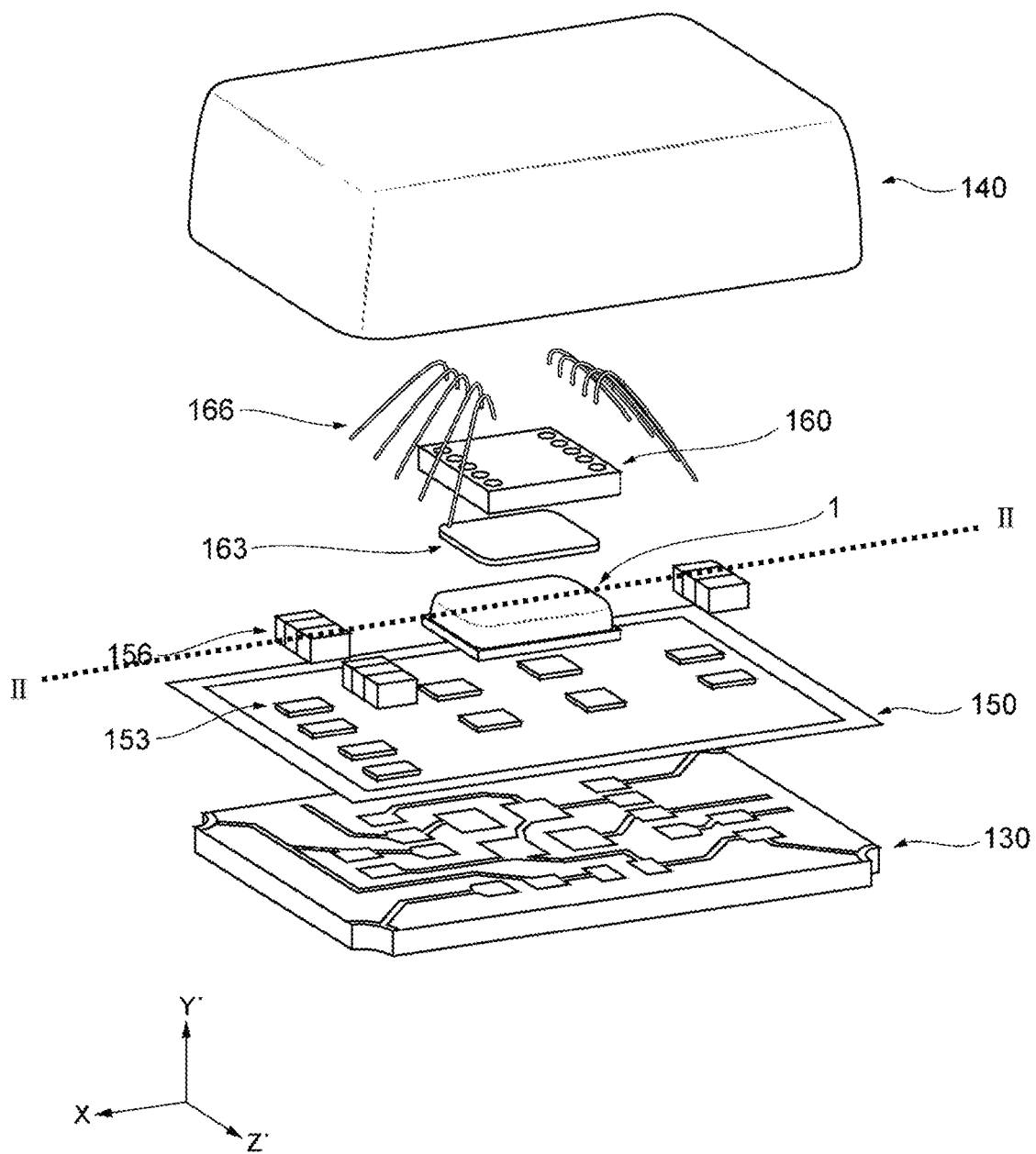
FIG. 1 is a schematic exploded perspective view of a structure of an electronic device in accordance with aspects of the present disclosure.

Aspects of the present disclosure will be described below with reference to the drawings. The drawings for each aspect illustrate mere examples. The dimensions and shapes of components are schematic, and the embodiments should not be construed as limitations on the technical scope of the present invention.

To clarify the relationship between the drawings and to help understanding of the positional relationship between components, each drawing may have an orthogonal coordinate system including an X axis, a Y' axis, and a Z' axis for convenience's sake. The X axis, the Y' axis, and the Z' axis in one drawing correspond to those in other drawings. The X axis, the Y' axis, and the Z' axis respectively correspond to crystallographic axes of a quartz crystal element 11 described below. The X axis corresponds to an electrical axis (polar axis) of a crystal, the Y axis corresponds to a machine axis of a crystal, and the Z axis corresponds to an optic axis of a crystal. The Y' axis and the Z' axis are axes respectively obtained by rotating the Y axis and the Z axis about the X axis in a direction from the Y axis to the Z axis by 35°15'+/−1 min. and 30 sec.

In the following description, a direction parallel to the X axis is referred to as an X-axis direction, a direction parallel to the Y' axis is referred to as a Y'-axis direction, and a direction parallel to the Z' axis is referred to as a Z'-axis direction. The directions in which the arrows of the X axis, Y' axis, and Z' axis point are referred to as plus (+) directions, and the directions opposite to these directions of the arrows are referred to as minus (−) directions. For convenience's sake, the +Y'-axis direction is described as an upward direction, and the −Y'-axis direction is described as a downward direction. However, the vertical directions of a quartz crystal resonator unit 1 and an electronic device 100 are not limited to this. For example, in the following description, the side of an external substrate 130 located in the +Y'-axis direction is defined as an upper surface 131A, and the side of the external substrate 130 located in the −Y'-axis direction is defined as a lower surface 131B. Instead, the electronic device 100 may be disposed to have the upper surface 131A located vertically below the lower surface 131B. This applies to an upper surface 31A and a lower surface 31B of a base member 30 of the quartz crystal resonator unit 1.

Figure 2:
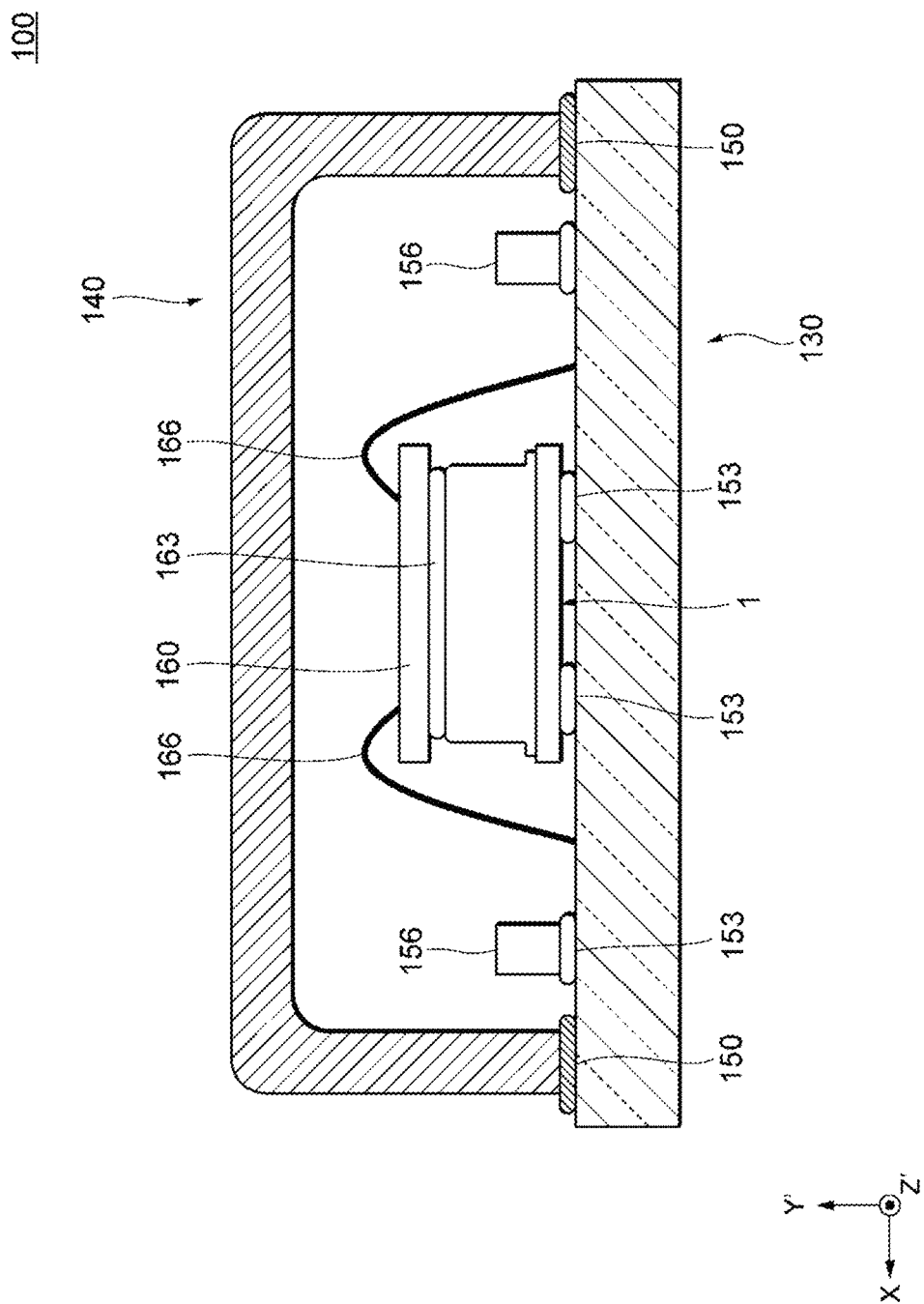
FIG. 2 is a cross-sectional view of the electronic device illustrated in FIG. 1 taken along line II-II.

First, with reference to FIG. 1 and FIG. 2, a schematic structure of the electronic device 100 according to an aspect of the disclosure will be described. FIG. 1 is a schematic exploded perspective view of a structure of an electronic device according to an aspect of the disclosure. FIG. 2 is a cross-sectional view of the electronic device illustrated in FIG. 1 taken along line II-II.

The electronic device 100 includes a quartz crystal resonator unit 1, an external substrate 130, an external cap 140, a sealing frame 150, solder portions 153, capacitors 156, an IC chip 160, a die bond adhesive 163, and bonding wires 166. The quartz crystal resonator unit 1, the solder portions 153, the capacitors 156, the IC chip 160, the die bond adhesive 163, and the bonding wires 166 are sealed in a space defined by the external substrate 130 and the external cap 140. For example, this space is liquid-tightly sealed, but may be airtightly sealed under vacuum, or airtightly sealed while being filled with gas such as an inert gas.

The quartz crystal resonator unit 1 is a type of a piezo-electric resonator unit, and is a quartz crystal resonator unit including a quartz crystal resonator. The quartz crystal resonator uses a quartz crystal element as a piezoelectric piece excited with a piezoelectric effect. The quartz crystal resonator unit 1 is mounted on the external substrate 130, and sealed in a space defined by the external substrate 130 and the external cap 140.

The external substrate 130 is a planar circuit board having an upper surface 131A and a lower surface 131B opposite to each other. The external substrate 130 is formed from, for example, alumina. A wiring layer is disposed on the upper surface 131A, and a terminal not illustrated is disposed on the lower surface 131B. A castellation electrode formed by metallizing a semi-through-hole is formed in a side surface of the external substrate 130. The wiring layer on the upper surface 131A and the terminal on the lower surface 131B are electrically connected with the castellation electrode.

The external cap 140 has a closed-end cavity facing the external substrate 130. The closed-end cavity accommodates the quartz crystal resonator unit 1. In other words, the external cap 140 includes a planar upper wall, and side walls extending from the outer edge of the upper wall toward the external substrate 130. The upper wall faces the external substrate 130 across the quartz crystal resonator unit 1. The side walls surround the quartz crystal resonator unit 1 in a plane direction parallel to the upper surface 131A of the external substrate 130.

The sealing frame 150 joins the external substrate 130 and the external cap 140 to each other. More specifically, the sealing frame 150 joins the upper surface 131A of the external substrate 130 and the ends of the side walls of the external cap 140 to each other. The sealing frame 150 has a rectangular frame shape. When the upper surface 131A of the external substrate 130 is viewed in a plan, the sealing frame 150 surrounds, for example, the quartz crystal resonator unit 1, the capacitors 156, and the IC chip 160. The sealing frame 150 is formed from, for example, an electrically insulating resin adhesive.

The capacitors 156 are mounted on the upper surface 131A of the external substrate 130. The capacitors 156 are electrically connected to the quartz crystal resonator unit 1 or the IC chip 160 through the wiring layer on the external substrate 130. Each capacitor 156 is, for example, part of an oscillation circuit that oscillates the quartz crystal resonator unit 1.

The solder portions 153 join the wiring layer disposed on the upper surface 131A of the external substrate 130 to the quartz crystal resonator unit 1 or the capacitors 156.

The IC chip 160 is mounted on the quartz crystal resonator unit 1. The IC chip 160 is an application specific integrated circuit (ASIC) that controls the quartz crystal resonator unit 1. The IC chip 160 is, for example, part of a circuit that corrects the temperature characteristics of the quartz crystal resonator unit 1.

The die bond adhesive 163 joins the quartz crystal resonator unit 1 and the IC chip 160 to each other. The die bond adhesive 163 is formed from, for example, a resin adhesive. For example, the die bond adhesive 163 has electric conductivity, and allows the quartz crystal resonator unit 1 to be grounded therethrough. The die bond adhesive 163 preferably contains a low-elastic resin, for example, silicone resin. Thus, the die bond adhesive 163 can reduce stress on the IC chip 160. The die bond adhesive 163 is preferably formed from a material with high heat conductivity. Thus, the temperature of the IC chip 160 is more easily changeable following the temperature of the quartz crystal resonator unit 1.

The bonding wires 166 electrically connect the IC chip 160 to the wiring layer on the external substrate 130.

Figure 3:
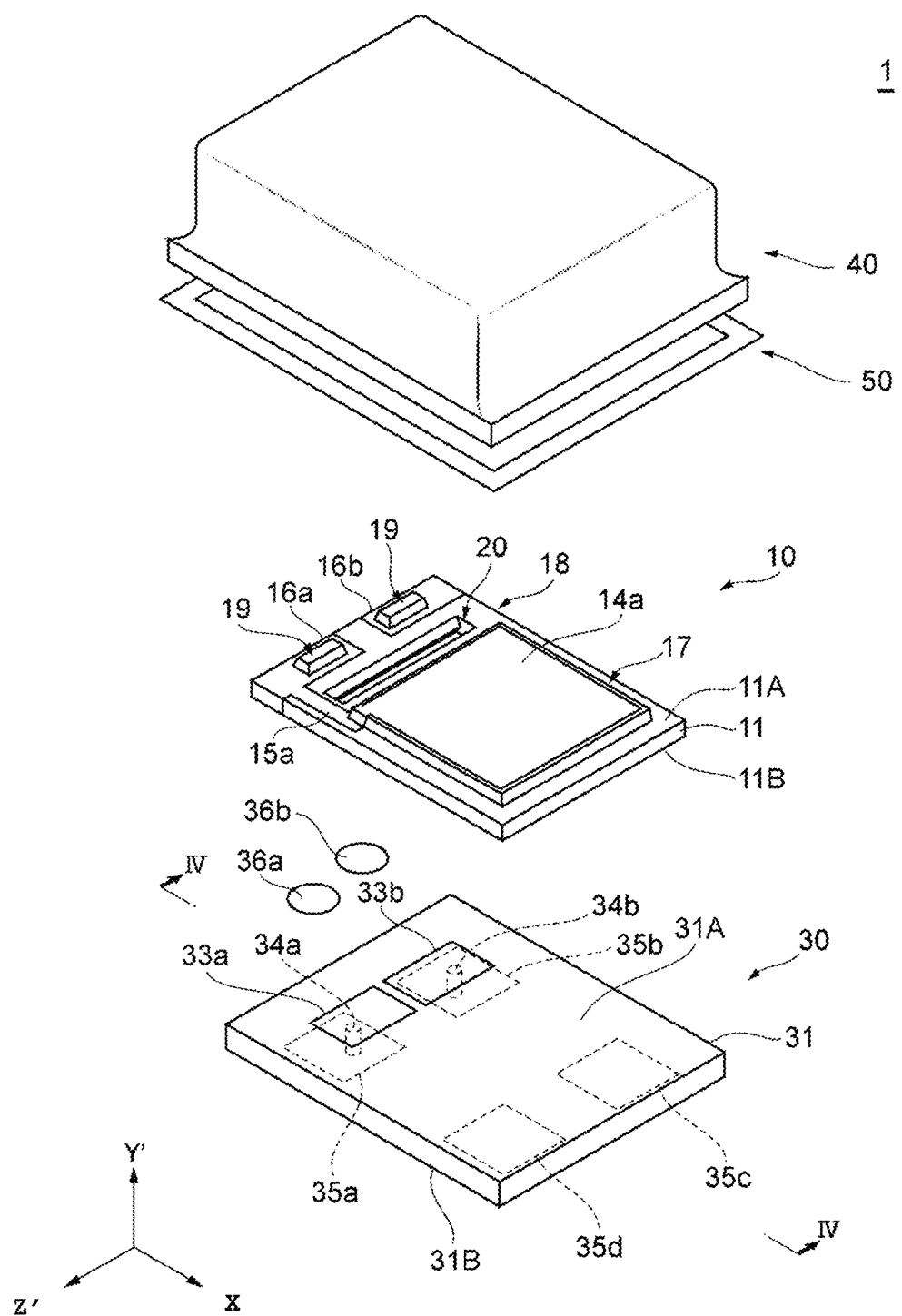
FIG. 3 is a schematic exploded perspective view of a structure of a quartz crystal resonator unit in accordance with aspects of the present disclosure.
Figure 4:
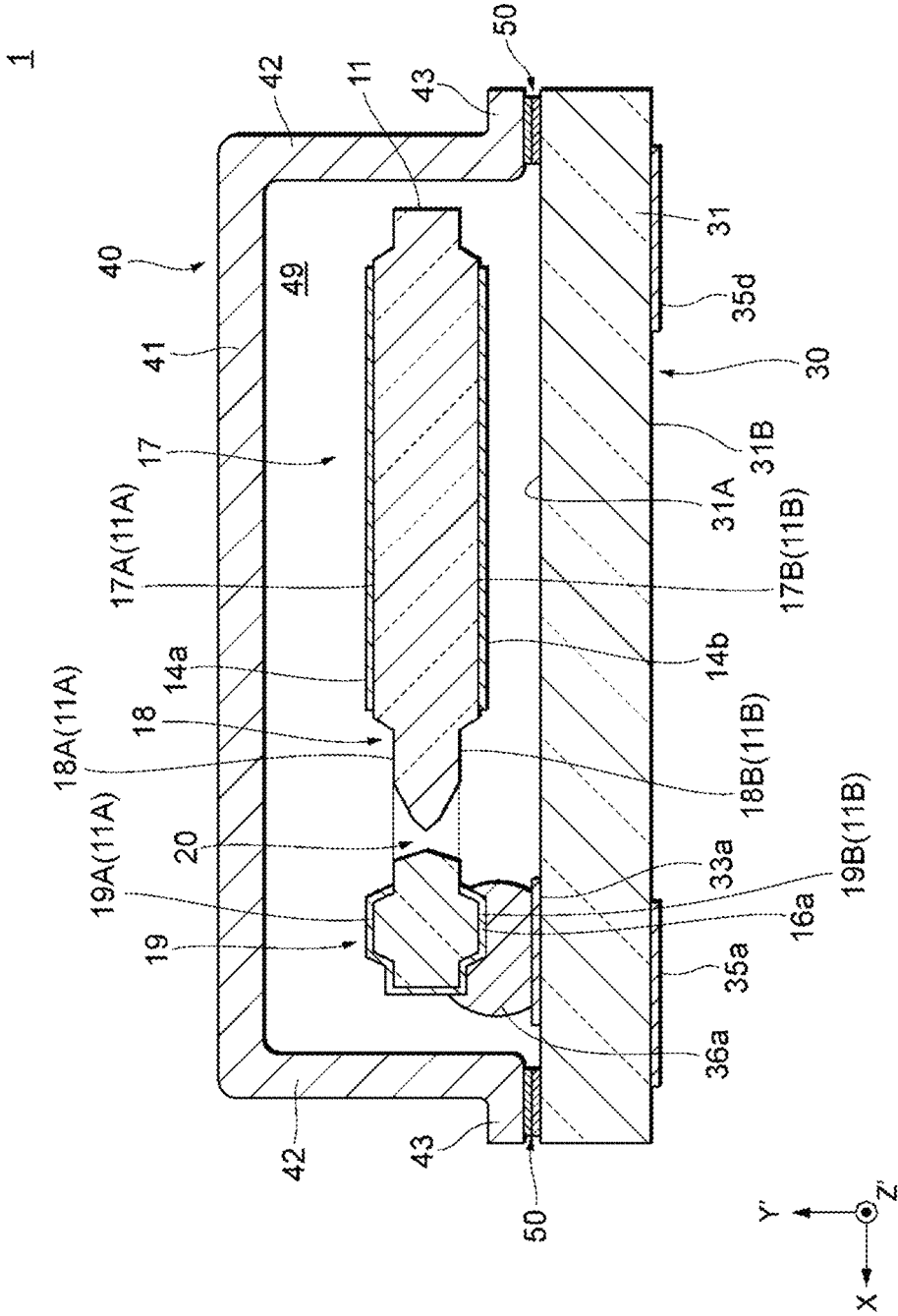
FIG. 4 is a cross-sectional view of the quartz crystal resonator unit illustrated in FIG. 3 taken along line IV-IV.

Subsequently, with reference to FIG. 3 and FIG. 4, a structure of the quartz crystal resonator unit 1 according to an aspect of the disclosure will be described. FIG. 3 is a schematic exploded perspective view of the structure of the quartz crystal resonator unit according to an aspect of the disclosure. FIG. 4 is a cross-sectional view of the quartz crystal resonator unit illustrated in FIG. 3 taken along line Iv-Iv.

The quartz crystal resonator unit 1 includes a quartz crystal resonator 10, a base member 30, a lid member 40, and a joint member 50. The quartz crystal resonator 10 is disposed between the base member 30 and the lid member 40. The base member 30 and the lid member 40 form a retainer to accommodate the quartz crystal resonator 10. In the example illustrated in FIG. 3 and FIG. 4, the base member 30 is planar, and the quartz crystal resonator 10 is accommodated in a recess 49 in the lid member 40. However, the shapes of the base member 30 and the lid member 40 are not limited to the above, and may be any shape with which the retainer can accommodate at least an excited portion of the quartz crystal resonator 10. For example, the base member 30 may have a recess on a side facing the lid member 40 to accommodate at least part of the quartz crystal resonator 10.

First, the quartz crystal resonator 10 will be described below.

The quartz crystal resonator 10 is an element that vibrates a crystal with the piezoelectric effect, and converts energy between electric energy and kinetic energy. The quartz crystal resonator 10 includes a thin quartz crystal element 11, a first excitation electrode 14a and a second excitation electrode 14b forming a pair of excitation electrodes, a first extended electrode 15a and a second extended electrode 15b forming a pair of extended electrodes, and a first connection electrode 16a and a second connection electrode 16b forming a pair of connection electrodes.

The quartz crystal element 11 has an upper surface 11A and a lower surface 11B opposite to each other. The upper surface 11A is located on the side opposite to the side facing the base member 30, that is, located to face an upper wall 41, described below, of the lid member 40. The lower surface 11B is located to face the base member 30. The upper surface 11A and the lower surface 11B correspond to a pair of main surfaces of the quartz crystal element 11.

The quartz crystal element 11 is, for example, an AT-cut quartz crystal element. In an orthogonal coordinate system including the X axis, the Y' axis, and the Z' axis crossing one another, the AT-cut quartz crystal element 11 has, as a main surface, a plane (hereinafter referred to as a "XZ' plane", and other planes specified with other axes are also referred similarly) parallel to the plane specified with the X axis and the Z' axis, and has a thickness in a direction parallel to the Y' axis. For example, the AT-cut quartz crystal element 11 is formed by etching a crystal substrate (for example, a crystal wafer) obtained by cutting and grinding a grain of a synthetic quartz crystal.

The quartz crystal resonator 10 including the AT-cut quartz crystal element 11 has high frequency stability within a wide temperature range. The AT-cut quartz crystal resonator 10 vibrates in a thickness shear vibration mode as main vibrations. Rotation angles of the Y' axis and the Z' axis in the AT-cut quartz crystal element 11 may be inclined from 35°15' within a range of −5° to +15°. The cut angle of the quartz crystal element 11 may be different from the AT cut, for example, a BT cut, a GT cut, or an SC cut.

The AT-cut quartz crystal element 11 has a shape of a board having a long-side direction in which the long sides parallel to the X-axis direction extend, a short-side direction in which the short sides parallel to the Z'-axis direction extend, and a thickness direction in which the thickness parallel to the Y'-axis direction extends. When the upper surface 11A of the quartz crystal element 11 is viewed in a plan, the quartz crystal element 11 has a rectangular shape.

When the upper surface 11A of the quartz crystal element 11 is viewed in a plan, the quartz crystal element 11 includes an exciter 17 that is located at the center and causes excitation, a peripheral portion 18 adjacent to the exciter 17, and connectors 19 connected to the base member 30. The exciter 17 has a rectangular island shape, and is surrounded by the frame-shaped peripheral portion 18. The connectors 19 are located at an end portion of the quartz crystal element 11 in the +X-axis direction to form a pair of rectangular islands arranged in the Z'-axis direction. Part of the peripheral portion 18 is disposed between the exciter 17 and the connectors 19.

The shape of the quartz crystal element 11 when the upper surface 11A is viewed in a plan is not limited to a rectangular shape. The shape of the quartz crystal element 11 in a plan view may be polygonal, circular, elliptical, or a combination of these. The shape of the exciter 17 in a plan view is not limited to a rectangular shape, and the shape of the peripheral portion 18 in a plan view is not limited to a frame shape. For example, the exciter 17 and the peripheral portion 18 may have a belt shape throughout in the Z'-axis direction of the quartz crystal element 11. The shape of the connectors 19 in a plan view is not limited to a pair of rectangular island shape. The shape of the connectors 19 in a plan view may be polygonal, circular, elliptical, or a combination of these. The connectors 19 may form a single continuous belt extending in the Z'-axis direction. In other words, both the first connection electrode 16a and the second connection electrode 16b may be disposed on a single connector 19.

The exciter 17 has an upper surface 17A and a lower surface 17B, the peripheral portion 18 has an upper surface 18A and a lower surface 18B, and each connector 19 has an upper surface 19A and a lower surface 19B. Each of the upper surfaces 17A, 18A, and 19A is part of the upper surface 11A of the quartz crystal element 11. Each of the lower surfaces 17B, 18B, and 19B is part of the lower surface 11B of the quartz crystal element 11. The upper surface 17A and the lower surface 17B correspond to a pair of main surfaces of the quartz crystal element 11 at the exciter 17. The upper surface 18A and the lower surface 18B correspond to a pair of main surfaces of the quartz crystal element 11 at the peripheral portion 18. The upper surface 19A and the lower surface 19B correspond to a pair of main surfaces of the quartz crystal element 11 at each connector 19. The upper surfaces 17A, 18A, and 19A and the lower surfaces 17B, 18B, and 19B are XZ' planes.

The quartz crystal element 11 has a so-called mesa structure, with the thickness of the exciter 17 larger than the thickness of the peripheral portion 18. The quartz crystal element 11 having a mesa structure at the exciter 17 can reduce vibration leakage from the exciter 17. The quartz crystal element 11 has a mesa structure on both sides, and the exciter 17 protrudes from the peripheral portion 18 on both the upper surface 11A and the lower surface 11B. A boundary between the exciter 17 and the peripheral portion 18 has a taper shape having a continuously changing thickness. In other words, a surface connecting the upper surfaces 17A and 18A of the exciter 17 and the peripheral portion 18 and a surface connecting the lower surfaces 17B and 18B of the exciter 17 and the peripheral portion 18 are slopes with a uniform inclination.

The boundary between the exciter 17 and the peripheral portion 18 may have a stepped shape having a discontinuously changing thickness. The boundary may have a convex shape having a continuously changing thickness, or a bevel shape having a discontinuously changing thickness. In other words, a surface connecting the upper surfaces 17A and 18A of the exciter 17 and the peripheral portion 18 and a surface connecting the lower surfaces 17B and 18B of the exciter 17 and the peripheral portion 18 may each include multiple slopes or a curved surface. The exciter 17 may have a mesa structure on a single side to protrude from the peripheral portion 18 on either the upper surface 11A or the lower surface 11B of the quartz crystal element 11. The quartz crystal element 11 may have a so-called inverted mesa structure with the thickness of the exciter 17 smaller than the thickness of the peripheral portion 18.

The quartz crystal element 11 has a mesa structure on both surfaces at the connectors 19. In other words, the thickness of the connectors 19 is larger than the thickness of the peripheral portion 18. A boundary between the connector 19 and the peripheral portion 18 has a taper shape. A surface connecting the upper surfaces 19A and 18A of the connector 19 and the peripheral portion 18 and a surface connecting the lower surfaces 19B and 18B of the connector 19 and the peripheral portion 18 are slopes with a uniform inclination. The quartz crystal element 11 having a mesa structure at each connector 19 improves bonding strength of the quartz crystal resonator 10 to electro conductive holding members 36a and 36b. For example, the mesa structure at each connector 19 is concurrently formed in the same process as forming the mesa structure at the exciter 17.

The thickness of each connector 19 is, for example, substantially the same as the thickness of the exciter 17. The upper surface 19A of each connector 19 is flush with the upper surface 17A of the exciter 17, and the lower surface 19B of each connector 19 is flush with the lower surface 17B of the exciter 17. The thickness of each connector 19 may be different from the thickness of the exciter 17, for example, smaller than the thickness of the exciter 17. The upper surfaces 17A and 19A may be spaced apart from each other in the Y'-axis direction, and the lower surfaces 17B and 19B may be spaced apart from each other in the Y'-axis direction. For example, the upper surface 19A may be located closer to substantially the center of the quartz crystal element 11 in the Y'-axis direction than the upper surface 17A. The lower surface 19B may be located closer to substantially the center of the quartz crystal element 11 in the Y'-axis direction than the lower surface 17B.

The boundary between the connectors 19 and the peripheral portion 18 may have a stepped shape, convex shape, or a bevel shape. In other words, a surface connecting the upper surfaces 19A and 18A of each connector 19 and the peripheral portion 18 and a surface connecting the lower surfaces 19B and 18B of the connector 19 and the peripheral portion 18 may each include multiple slopes or a curved surface. Each connector 19 may have a mesa structure on a single side to protrude from the peripheral portion 18 on the lower surface 11B of the quartz crystal element 11.

The peripheral portion 18 has a through-hole 20 between the exciter 17 and the connectors 19. The through-hole 20 extends through the peripheral portion 18 in the Y'-axis direction. The through-hole 20 will be described in detail below.

The first excitation electrode 14a is disposed on the upper surface 17A of the exciter 17, and the second excitation electrode 14b is disposed on the lower surface 17B of the exciter 17. The first excitation electrode 14a and the second excitation electrode 14b oppose each other across the quartz crystal element 11. When the upper surface 11A of the quartz crystal element 11 is viewed in a plan, the first excitation electrode 14a and the second excitation electrode 14b each have a rectangular shape, and are disposed to overlap each other substantially entirely. The first excitation electrode 14a and the second excitation electrode 14b correspond to a pair of excitation electrodes.

The shapes of the first excitation electrode 14a and the second excitation electrode 14b when the upper surface 11A of the quartz crystal element 11 is viewed in a plan are not limited to a rectangular shape. The shapes of the first excitation electrode 14a and the second excitation electrode 14b viewed in a plan may be polygonal, circular, elliptical, or a combination of these.

The first extended electrode 15a is disposed on the upper surface 18A of the peripheral portion 18, and the second extended electrode 15b is disposed on the lower surface 18B of the peripheral portion 18. The first extended electrode 15a electrically connects the first excitation electrode 14a and the first connection electrode 16a to each other. The second extended electrode 15b electrically connects the second excitation electrode 14b and the second connection electrode 16b to each other. The first end of the first extended electrode 15a is connected to the first excitation electrode 14a at the exciter 17, and the second end of the first extended electrode 15a is connected to the first connection electrode 16a at the corresponding connector 19. The first end of the second extended electrode 15b is connected to the second excitation electrode 14b at the exciter 17, and the second end of the second extended electrode 15b is connected to the second connection electrode 16b at the corresponding connector 19. When the upper surface 11A of the quartz crystal element 11 is viewed in a plan, the first extended electrode 15a is located in the +Z'-axis direction from the through-hole 20, and the second extended electrode 15b is located in the −Z'-axis direction from the through-hole 20. The first extended electrode 15a and the second extended electrode 15b are spaced apart from each other when viewed in a plan, and thus stray capacitance is reduced. In addition, the through-hole 20 is formed between the first extended electrode 15a and the second extended electrode 15b, and thus stray capacitance is further reduced.

The first connection electrode 16a and the second connection electrode 16b are disposed on the lower surfaces 19B of the connectors 19. The first connection electrode 16a is located in the +Z'-axis direction from the second connection electrode 16b. The first connection electrode 16a and the second connection electrode 16b are also disposed on the upper surfaces 19A of the connectors 19 and the side surfaces of the quartz crystal element 11.

A first electrode group including the first excitation electrode 14a, the first extended electrode 15a, and the first connection electrode 16a is continuously formed, and for example, integrally formed. Similarly, a second electrode group including the second excitation electrode 14b, the second extended electrode 15b, and the second connection electrode 16b is continuously formed, and for example, integrally formed. Thus, the quartz crystal resonator 10 includes a pair of electrodes. The pair of electrodes of the quartz crystal resonator 10 have, for example, a multilayer structure, and are formed by laminating a base layer and an outermost layer in this order. The base layer is a layer that comes into contact with the quartz crystal element 11, and is thus formed from a material that preferably adheres to the quartz crystal element 11. The outermost layer is a layer located outermost of the pair of electrodes, and is formed from a material with high chemical stabilization. This structure can reduce oxidation of the pair of electrodes or detachment of the pair of electrodes from the quartz crystal element 11, and thus the quartz crystal resonator 10 is highly reliable. The base layer contains, for example, chromium (Cr), and the outermost layer contains, for example, gold (Au).

When a voltage can be applied to the exciter 17, at least one of the pair of electrodes of the quartz crystal resonator 10 may be spaced apart from the quartz crystal element 11. For example, a gap may be provided between the first excitation electrode 14a and the exciter 17, or gaps may be provided between the exciter 17 and the first excitation electrode 14a and between the exciter 17 and the second excitation electrode 14b. The material of the pair of electrodes of the quartz crystal resonator 10 is not limited to Cr and Au, but the pair of electrodes may contain a metal material such as titanium (Ti), molybdenum (Mo), aluminum (Al), nickel (Ni), indium (In), palladium (Pd), silver (Ag), copper (Cu), tin (Sn), or iron (Fe). The pair of electrodes may contain, for example, electroconductive ceramics, electroconductive resin, or a semiconductor.

Subsequently, the base member 30 will be described below.

The base member 30 holds the quartz crystal resonator 10 while allowing the quartz crystal resonator 10 to cause excitation. The base member 30 includes a substrate 31 having an upper surface 31A and a lower surface 31B opposite to each other. The upper surface 31A and the lower surface 31B correspond to a pair of main surfaces of the substrate 31. The upper surface 31A is located to face the quartz crystal resonator 10 and the lid member 40, and corresponds to a mount surface on which the quartz crystal resonator 10 is mounted. The lower surface 31B is located to face the external substrate 130, and corresponds to a mount surface to which the external substrate 130 is connected. The substrate 31 is formed from, for example, a sintered material such as an insulating ceramic (alumina). To reduce an occurrence of thermal stress, the substrate 31 is preferably formed from a heat-resistant material. To reduce the stress imposed on the quartz crystal resonator 10 with thermal hysteresis, the substrate 31 may be formed from a material having a coefficient of thermal expansion close to that of the quartz crystal element 11, or may be formed from, for example, a crystal. To reduce damage to the substrate 31 from thermal stress, the substrate 31 may be formed from a material having a coefficient of thermal expansion close to that of the lid member 40.

The base member 30 includes a first electrode pad 33a and a second electrode pad 33b. The first electrode pad 33a and the second electrode pad 33b are disposed on the upper surface 31A of the substrate 31. The first electrode pad 33a and the second electrode pad 33b are terminals used to electrically connect the quartz crystal resonator 10 to the base member 30. To reduce deterioration in reliability due to oxidation, the outermost layers of the first electrode pad 33a and the second electrode pad 33b preferably contain gold, and more preferably contain substantially only gold. For example, the first electrode pad 33a and the second electrode pad 33b may have a laminated structure including a base layer that enhances adhesion with the substrate 31 and an outermost layer containing gold to reduce oxidation. The first electrode pad 33a and the second electrode pad 33b correspond to a pair of electrode pads.

The base member 30 includes a first outer electrode 35a, a second outer electrode 35b, a third outer electrode 35c, and a fourth outer electrode 35d. The first outer electrode 35a to the fourth outer electrode 35d are disposed on the lower surface 31B of the substrate 31. The first outer electrode 35a and the second outer electrode 35b are terminals that allow the wiring layer on the external substrate 130 and the quartz crystal resonator unit 1 to be electrically connected to each other. The third outer electrode 35c and the fourth outer electrode 35d are dummy electrodes to and from which, for example, electric signals are not input or output. However, the lid member 40 may be a ground electrode that is grounded to improve the electromagnetic shielding function of the lid member 40. The third outer electrode 35c and the fourth outer electrode 35d may be omitted.

The first electrode pad 33a is electrically connected to the first outer electrode 35a through a first penetration electrode 34a that extends through the substrate 31 in the Y'-axis direction. The second electrode pad 33b is electrically connected to the second outer electrode 35b through a second penetration electrode 34b that extends through the substrate 31 in the Y'-axis direction.

The first outer electrode 35a and the second electrode pad 33b may respectively be electrically connected to the first outer electrode 35a and the second outer electrode 35b through side electrodes disposed on the side surfaces connecting the upper surface 31A and the lower surface 31B of the substrate 31 to each other. Each side electrode may be a castellation electrode.

The base member 30 includes a first electroconductive holding member 36a and a second electroconductive holding member 36b. The first electroconductive holding member 36a and the second electroconductive holding member 36b hold the quartz crystal resonator 10 while allowing the quartz crystal resonator 10 to cause excitation. In other words, the base member 30 holds the quartz crystal resonator 10 while preventing the exciter 17 from coming into contact with the base member 30 and the lid member 40. The first electroconductive holding member 36a and the second electroconductive holding member 36b electrically connect the quartz crystal resonator 10 and the base member 30 to each other. More specifically, the first electroconductive holding member 36a electrically connects the first electrode pad 33a and the first connection electrode 16a to each other, and the second electroconductive holding member 36b electrically connects the second electrode pad 33b and the second connection electrode 16b to each other. The first electroconductive holding member 36a and the second electroconductive holding member 36b correspond to a pair of electroconductive holding members.

The first electroconductive holding member 36a and the second electroconductive holding member 36b are formed from cured electroconductive adhesive such as a thermosetting resin or a photosetting resin. Examples of the main contents of the first electroconductive holding member 36a and the second electroconductive holding member 36b include silicone resin. The first electroconductive holding member 36a and the second electroconductive holding member 36b contain electroconductive particles. Examples of the electroconductive particles include metal particles containing silver (Ag).

The main content of the first electroconductive holding member 36a and the second electroconductive holding member 36b is not limited to silicone resin, and may be any curable resin such as epoxy resin or acrylic resin. The electroconductivity of the first electroconductive holding member 36a and the second electroconductive holding member 36b is provided not only by silver particles, but may be provided by other materials such as other metals, electroconductive ceramics, or electroconductive organic materials. The main content of the first electroconductive holding member 36a and the second electroconductive holding member 36b may be an electroconductive high polymer.

A resin composite of the first electroconductive holding member 36a and the second electroconductive holding member 36b may contain an appropriate additive. Examples of the additive include a tackifier, a filler, a thickener, a sensitizer, an antioxidant, and an antifoaming agent to improve, for example, the work efficiency or preservability of the electroconductive adhesive. Instead, a filler that increases the strength of the cured object or that keeps the distance between the base member 30 and the quartz crystal resonator 10 may be added.

Subsequently, the lid member 40 will be described below.

The lid member 40 is joined to the base member 30. The lid member 40 defines an internal space between itself and the base member 30 to accommodate the quartz crystal resonator 10. The lid member 40 has a recess 49 that opens to the base member 30. The internal space according to an aspect of the present disclosure corresponds to the space inside the recess 49. For example, the recess 49 is sealed under vacuum, but may be sealed while being filled with inert gas such as nitrogen or rare gas. The recess 49 may be liquid-tightly sealed. The material of the lid member 40 is preferably an electroconductive material, or more preferably a highly air-tight metal material. When the lid member 40 is formed from an electroconductive material, the lid member 40 has an electromagnetic shielding function to reduce electromagnetic waves coming into and going out from the internal space. The lid member 40 allows the IC chip 160 to be grounded therethrough. To reduce an occurrence of thermal stress, the material of the lid member 40 preferably has a coefficient of thermal expansion close to that of the substrate 31, and is, for example, a Fe—Ni—Co alloy having a coefficient of thermal expansion at or around room temperature overlapping with that of glass or ceramics in a wide temperature range. The material of the lid member 40 may be the same as the material of the substrate 31, and the lid member 40 may contain, for example, ceramics, a crystal, or resin.

The lid member 40 includes the planar upper wall 41 and side walls 42 connected to the outer edge of the upper wall 41 and extending in the height direction. The recess 49 in the lid member 40 is defined by the upper wall 41 and the side walls 42. More specifically, the upper wall 41 extends along the upper surface 31A of the substrate 31, and faces the base member 30 in the height direction across the quartz crystal resonator 10. The side walls 42 extend from the upper wall 41 to the base member 30 to surround the quartz crystal resonator 10 in the direction parallel to the upper surface 31A of the substrate 31. The lid member 40 also includes a flange 43 that is connected to the far ends of the side walls 42 facing the base member 30 and extends outward along the upper surface 31A of the substrate 31. In other words, the upper wall 41 connected to the upper end portions of the side walls 42 and the flange 43 connected to the lower end portions of the side walls 42 extend in directions opposite to each other. When the upper surface 31A of the substrate 31 is viewed in a plan, the flange 43 has a frame shape to surround the quartz crystal resonator 10.

Subsequently, the joint member 50 will be described below.

The joint member 50 extends throughout the peripheries of the base member 30 and the lid member 40 to form a rectangular frame. When the upper surface 31A of the base member 30 is viewed in a plan, the first electrode pad 33a and the second electrode pad 33b are located on the inner side of the joint member 50, and the joint member 50 is disposed to surround the quartz crystal resonator 10. The joint member 50 joins the base member 30 and the lid member 40 to each other to seal the recess 49 corresponding to the internal space. More specifically, the joint member 50 joins the substrate 31 and the flange 43 to each other. To reduce changes in frequency characteristics of the quartz crystal resonator 10, the material of the joint member 50 preferably has low moisture permeability, and more preferably has low gas permeability. To electrically connect the lid member 40 to a ground potential through the joint member 50, preferably, the joint member 50 has electroconductivity. In view of these, a preferable material of the joint member 50 is metal. For example, the joint member 50 includes a metalized layer disposed on the upper surface 31A of the substrate 31 and formed from molybdenum (Mo), and a metal solder layer disposed between the metalized layer and the flange 43 and formed from a gold-tin (Au—Sn) eutectic alloy.

The joint member 50 may be formed from an inorganic adhesive such as a silicon adhesive including water glass, or a calcium adhesive including cement. The material of the joint member 50 may be an epoxy, vinyl, acrylic, polyurethane, or silicone organic adhesive. When the joint member 50 is formed from an inorganic or organic adhesive, to lower the gas permeability, a coating with lower gas permeability than that of the adhesive may be applied to the outer side of the joint member 50. The base member 30 and the lid member 40 may be joined through seam welding.

Figure 5:
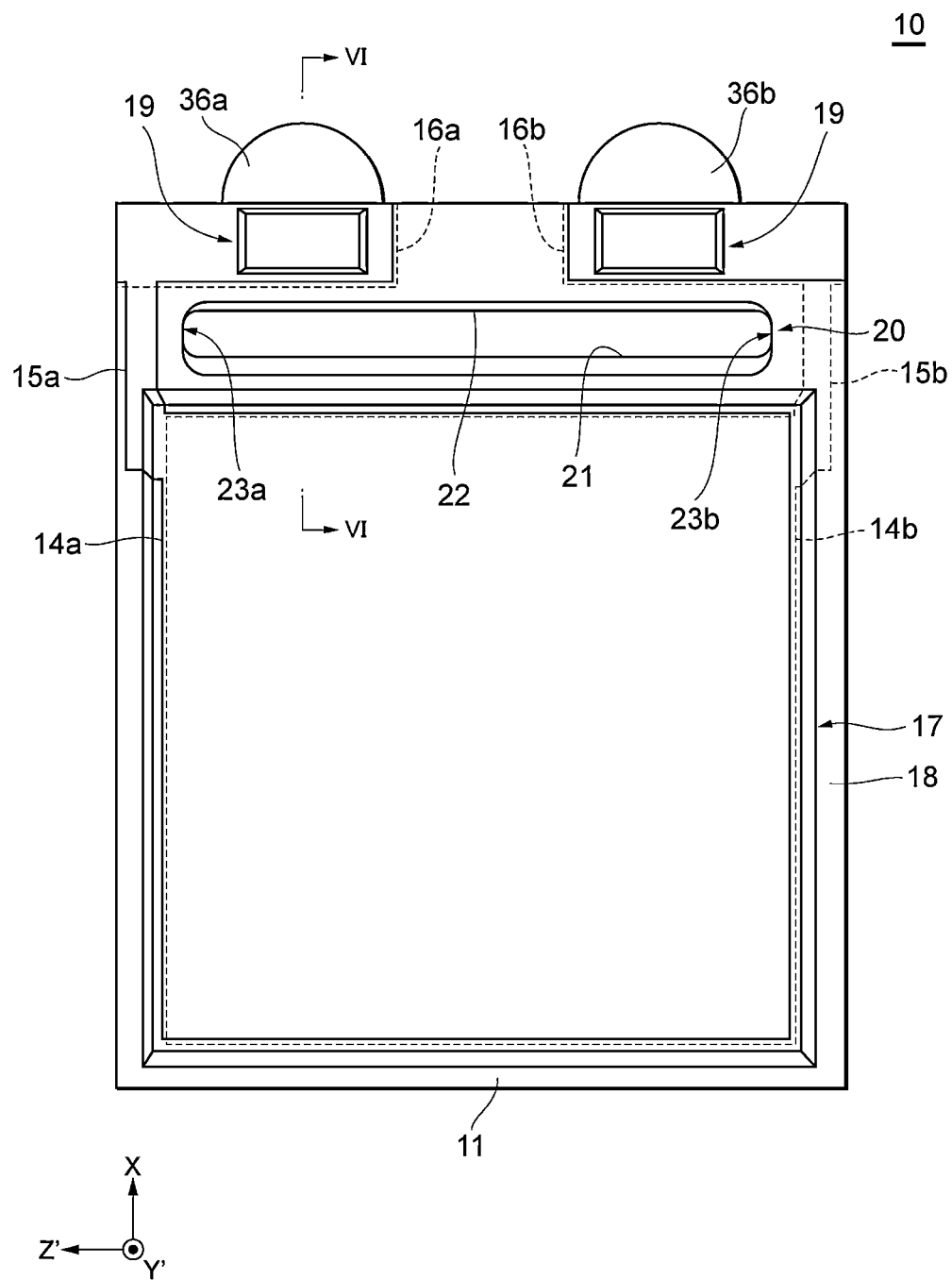
FIG. 5 is a schematic plan view of a structure of the quartz crystal resonator in accordance with aspects of the present disclosure.
Figure 6:
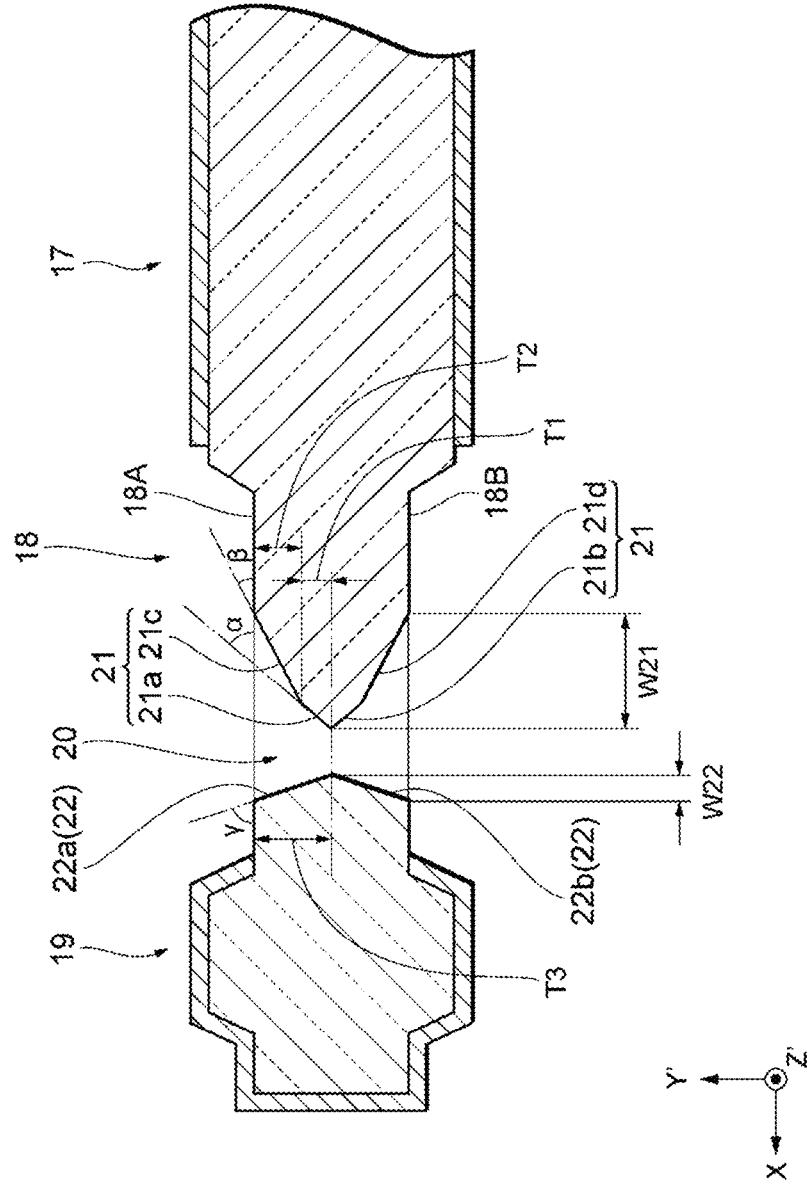
FIG. 6 is a cross-sectional view of the quartz crystal resonator illustrated in FIG. 5 taken along line VI-VI.
Figure 7:
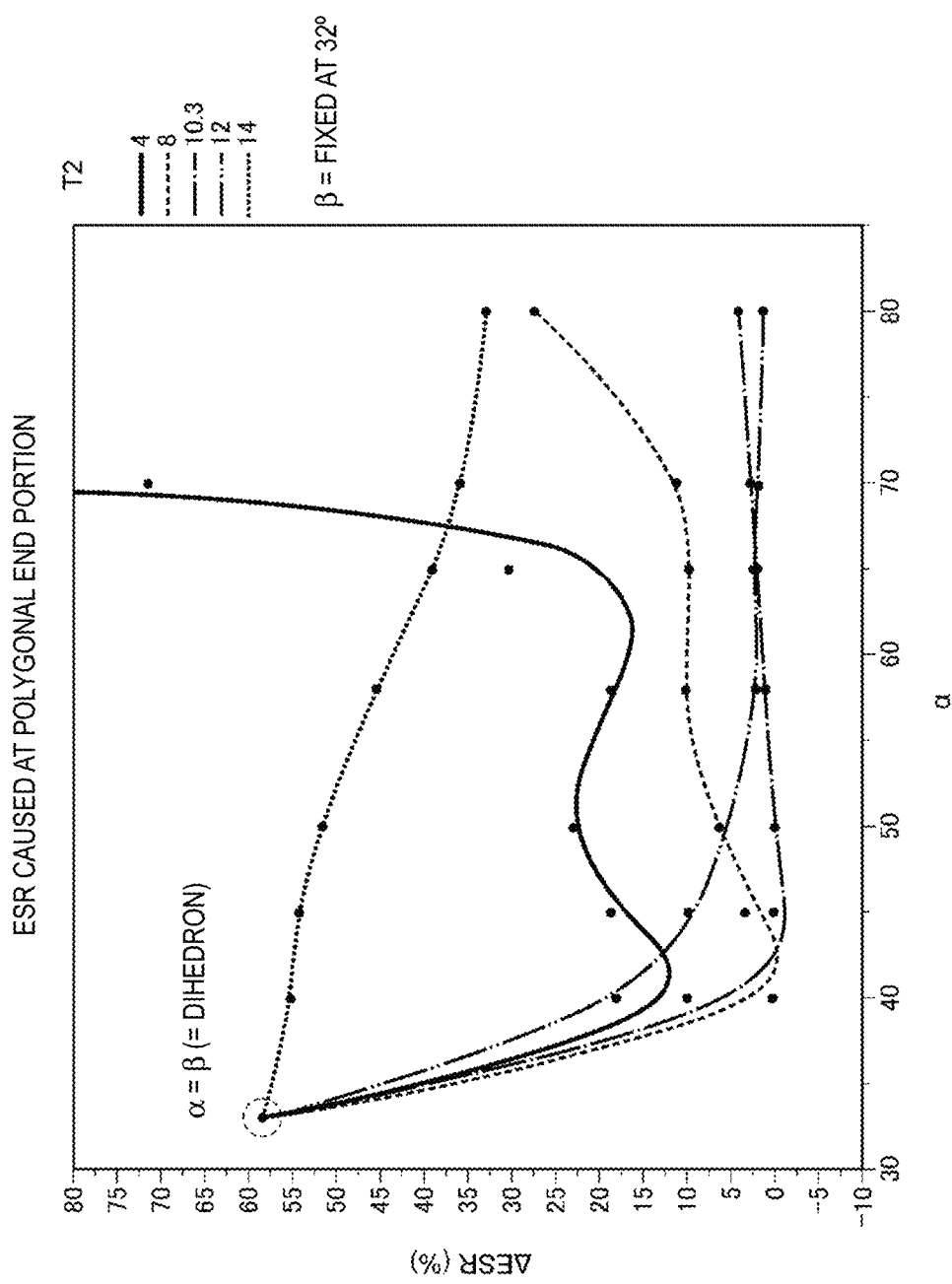
FIG. 7 is a graph showing the relationship between an ESR change rate and an angle $\alpha$.

With reference to FIG. 5 to FIG. 7, a structure of the through-hole 20 will be described further in detail below. FIG. 5 is a schematic plan view of a structure of a quartz crystal resonator according to an aspect of the present disclosure. FIG. 6 is a cross-sectional view of the quartz crystal resonator illustrated in FIG. 5 taken along line VI-VI. FIG. 7 is a graph illustrating the relationship between an ESR change rate and an angle α.

As illustrated in FIG. 5, the through-hole 20 extends in the Z'-axis direction, and has the entire periphery in the XZ' plane direction surrounded by the quartz crystal element 11. The through-hole 20 has an internal wall 21 located closer to the first excitation electrode 14a and the second excitation electrode 14b, and an internal wall 22 located closer to the first connection electrode 16a and the second connection electrode 16b. The internal walls 21 and 22 of the through-hole 20 protrude into the through-hole 20 to have their far ends toward each other, and extend in the Z'-axis direction.

As illustrated in FIG. 6, the internal wall 21 has four slopes 21a to 21d, and the internal wall 22 has two slopes 22a and 22b. The slope 21a corresponds to a first slope, and the slope 21c corresponds to a second slope.

The slopes 21a and 21c of the internal wall 21 face the upper wall 41 of the lid member 40, and the slopes 21b and 21d of the internal wall 21 face the base member 30. The slopes 21a and 21b are connected to each other at substantially the center of the through-hole 20 in a direction in which the through-hole 20 extends. The slopes 21a and 21c are connected to each other, and the slope 21c and the upper surface 18A of the peripheral portion 18 are connected to each other. The slopes 21b and 21d are connected to each other, and the slope 21d and the lower surface 18B of the peripheral portion 18 are connected to each other.

The slope 22a of the internal wall 22 faces the upper wall 41 of the lid member 40, and the slope 22b of the internal wall 22 faces the base member 30. The slopes 22a and 22b are connected to each other at substantially the center of the through-hole 20 in the direction in which the through-hole 20 extends (Y'-axis direction). The slope 22a and the upper surface 18A of the peripheral portion 18 are connected to each other, and the slope 22b and the lower surface 18B of the peripheral portion 18 are connected to each other.

Each of the internal walls 21 and 22 of the through-hole 20 is plane-symmetrical with respect to, for example, a plane parallel to the upper surface 18A of the peripheral portion 18. The plane with respect to which each of the internal walls 21 and 22 is plane-symmetrical is the XZ' plane including a connection between the slopes 21a and 21b, a connection between the slopes 22a and 22b, and substantially the center of the through-hole 20. The slope 21b is plane-symmetrical to the slope 21a. The slope 21c is plane-symmetrical to the slope 21d. The slope 22b is plane-symmetrical to the slope 22a. Thus, in the following description, the structures of the slopes 21b, 21d, and 22b will not be described.

The slope 21a of the internal wall 21 is inclined an angle α with respect to a plane parallel to the upper surface 18A of the peripheral portion 18. The slope 21c of the internal wall 21 is inclined an angle β with respect to the plane parallel to the upper surface 18A of the peripheral portion 18. The slope 22a of the internal wall 22 is inclined an angle γ with respect to the plane parallel to the upper surface 18A of the peripheral portion 18. The angle α is greater than the angle β, and the angle γ is greater than the angle α (γ>α>β).

A distance T1 is a thickness in the Y'-axis direction from substantially the center of the through-hole 20 where the connection between the slopes 21a and 21b is located to the connection between the slopes 21a and 21c. A distance T2 is a thickness in the Y'-axis direction from the connection between the slopes 21a and 21c to the connection between the slopes 21c and the upper surface 18A of the peripheral portion 18. A distance T3 is a thickness in the Y'-axis direction from substantially the center of the through-hole 20 where the connection between the slopes 22a and 22b are located to the connection between the slope 22a and the upper surface 18A of the peripheral portion 18. The distance T1 is smaller than the distance T2, and the distance T2 is smaller than the distance T3 (T1<T2<T3).

A width W21 is a distance in the X-axis direction from the connection between the slopes 21a and 21b to the connection between the slope 21c and the upper surface 18A. A width W22 is a distance in the X-axis direction from the connection between the slopes 22a and 22b to the connection between the slope 21a and the upper surface 18A. The width W21 is greater than the width W22 (W21>W22). The width W21 corresponds to the distance by which the internal wall 21 protrudes, and the width W22 corresponds to a distance by which the internal wall 21 protrudes. Thus, W21>W22 can be rephrased that the internal wall 21 of the through-hole 20 protrudes further than the internal wall 22 of the through-hole 20.

Each of the internal walls 21 and 22 of the through-hole 20 may be asymmetrical with respect to the plane parallel to the upper surface 18A of the peripheral portion 18. More specifically, the slopes 21a and 21b may have different sizes, or the slopes 21a and 21b may have different angles with respect to the XZ' plane. The slopes 21c and 21d may have different sizes, or the slopes 21c and 21d may have different angles with respect to the XZ' plane. The same applies to the slopes 22a and 22b.

The internal wall 21 may have at least four slopes other than the above. For example, the internal wall 21 may have six slopes. More specifically, the internal wall 21 may additionally have a slope connecting the slope 21c and the upper surface 18A and a slope connecting the slope 21d and the lower surface 18B. The numbers of slopes of the internal walls 21 and 22 may be different from the above provided that the internal wall 21 has more slopes than the internal wall 22. The internal walls 21 and 22 may have the same number of slopes or the internal walls 21 and 22 may have curved surfaces provided that the internal wall 21 protrudes further than the internal wall 22.

As illustrated in FIG. 7, equivalent series resistance (ESR) is reduced by changing the angle α, the angle β, and the distance T2. The graph in FIG. 7 illustrates an ESR change rate (ΔESR) when the angle α and the distance T2 are changed while the angle β is fixed at 32° and the distance T3 is fixed at 14.4 μm. The horizontal axis indicates the angle α, and the vertical axis indicates ΔESR. The plots in the graph indicate ΔESR when the distance T2 is 4 μm, 8 μm, 10.3 μm, 12 μm, and 14 μm.

As illustrated in FIG. 7, when β=32° and 32°<α<80°, by preferably setting the distance T2, ESR can be further reduced than when α=β=32°. When 40°<α, ESR can be more effectively reduced. When α<65°, ESR can be reduced regardless of when the distance T2 is small. When 8 μm≤T2≤12 μm, ESR can be more effectively reduced. Specifically, when 0.56≤T2/T3≤0.83, ESR can be more effectively reduced.

As illustrated in FIG. 5, the through-hole 20 has a first end 23a that connects the internal walls 21 and 22 at a portion located in the +Z'-axis direction, and has a second end 23b that connects the internal walls 21 and 22 at a portion located in the −Z'-axis direction. The first end 23a and the second end 23b of the through-hole 20 are located further from the center portion of the quartz crystal resonator 10 in the Z'-axis direction than the connectors 19. In other words, when the upper surface 11A of the quartz crystal element 11 is viewed in a plan, the through-hole 20 is located between the center portion of the exciter 17 and the connectors 19. The first electroconductive holding member 36a and the second electroconductive holding member 36b are connected to the connectors 19. Thus, when viewed from the first end 23a of the through-hole 20, the first electroconductive holding member 36a is located closer to the second end 23b than the first end 23a, and when viewed from the second end 23b of the through-hole 20, the second electroconductive holding member 36b is located closer to the first end 23a than the second end 23b. In other words, when the upper surface 11A of the quartz crystal element 11 is viewed in a plan, the through-hole 20 is located between the center portion of the exciter 17 and the first electroconductive holding member 36a, and also between the center portion of the exciter 17 and the second electroconductive holding member 36b. This structure reduces vibration leakage from the exciter 17 to the first electroconductive holding member 36a and the second electroconductive holding member 36b, and reduces stress propagated from the first electroconductive holding member 36a and the second electroconductive holding member 36b.

Figure 8:
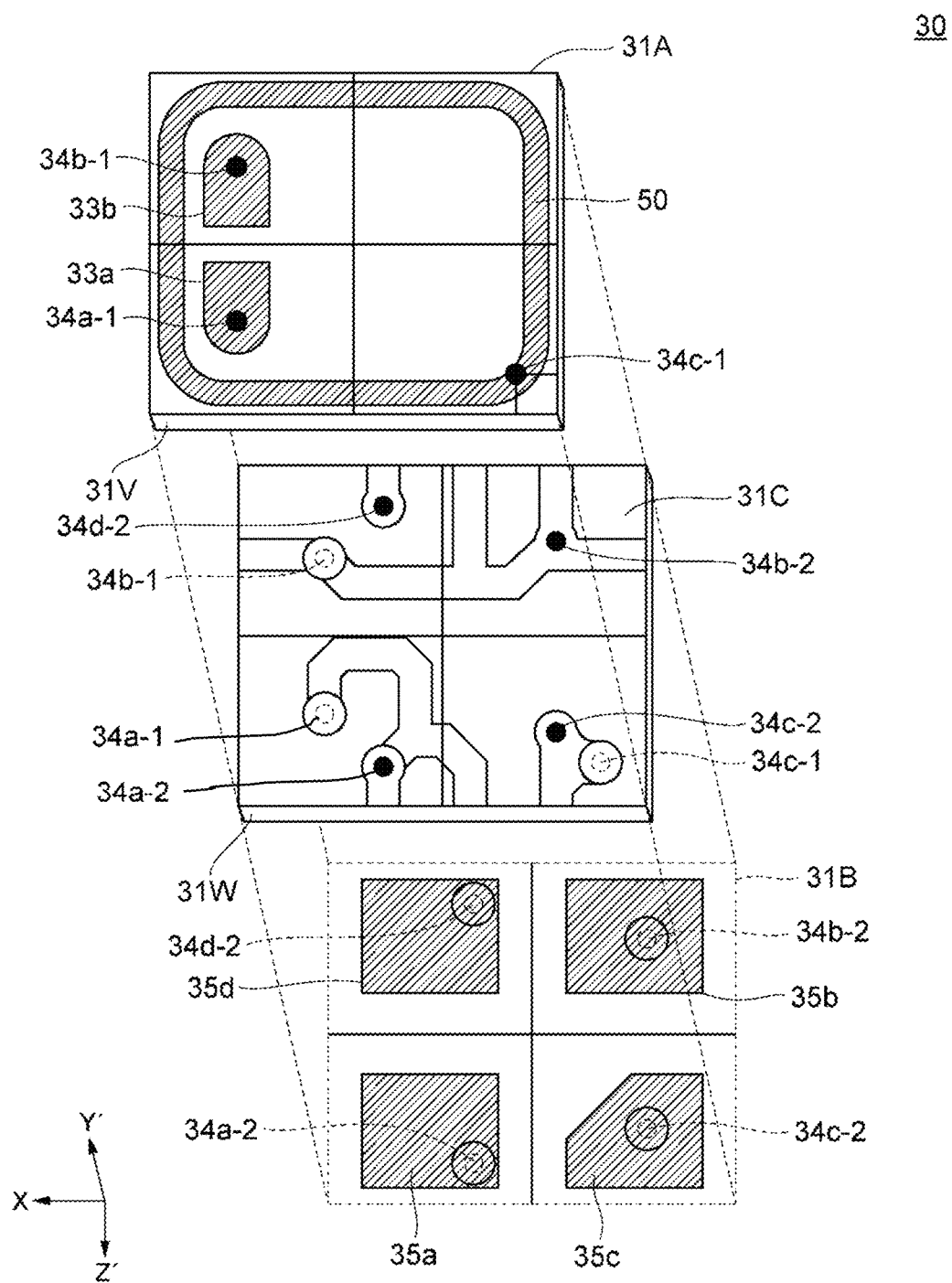
FIG. 8 is an exploded perspective view of an example structure of a base member.
Figure 9:
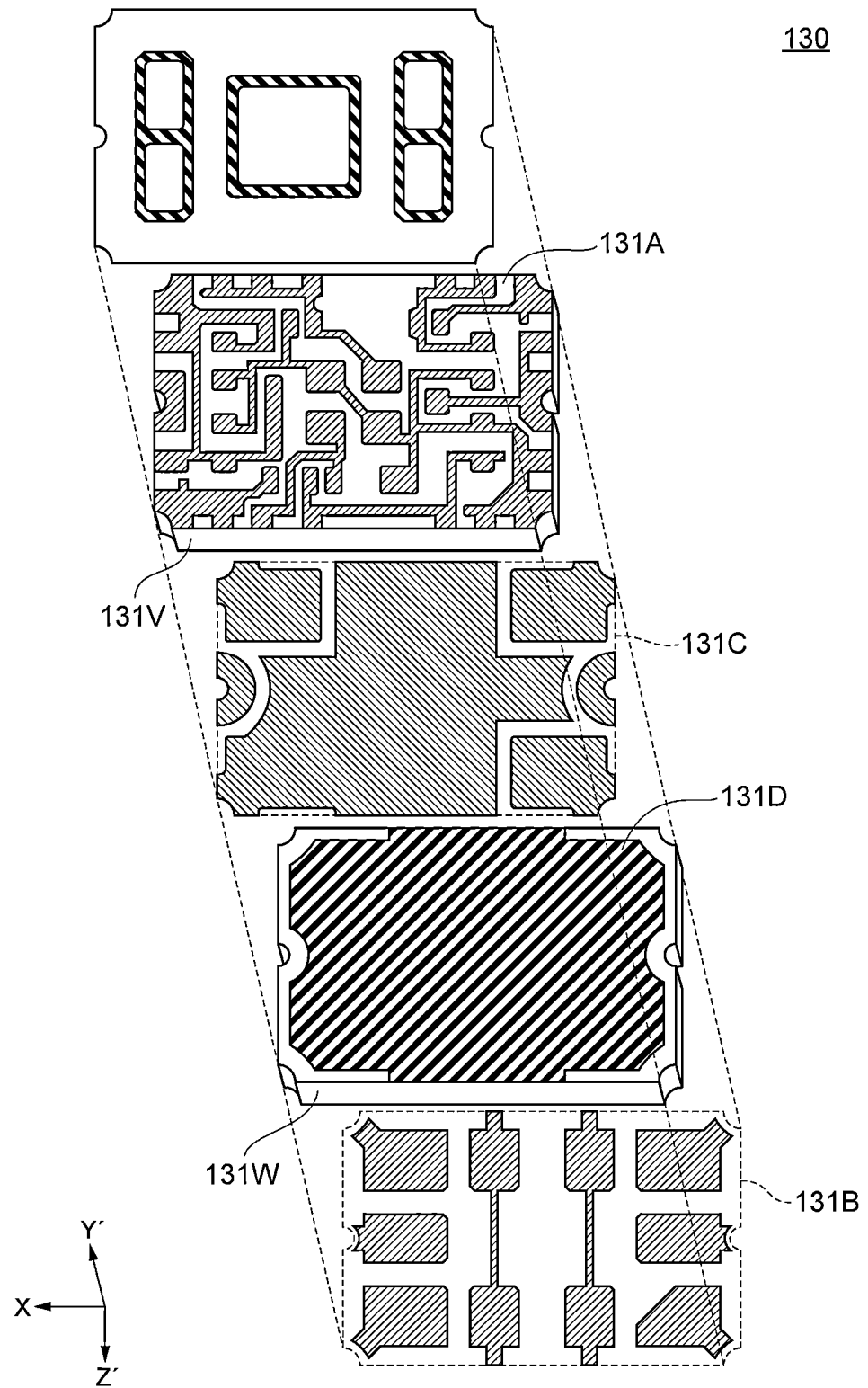
FIG. 9 is an exploded perspective view of an example structure of an external substrate.

Subsequently, with reference to FIG. 8 and FIG. 9, the base member 30 and the external substrate 130 will be described in further detail below. FIG. 8 is an exploded perspective view of an example of a structure of a base member. FIG. 9 is an exploded perspective view of an example of a structure of an external substrate.

As illustrated in FIG. 8, the base member 30 has a multilayer structure obtained by laminating substrates 31V and 31W formed from an insulating material. The upper surface of the substrate 31V corresponds to the upper surface 31A of the base member 30, and the lower surface of the substrate 31W corresponds to the lower surface 31B of the base member 30. A wiring layer 31C is disposed between the substrates 31V and 31W. Penetration electrodes 34a-1, 34b-1, and 34c-1 are disposed in the substrate 31V. Penetration electrodes 34a-2, 34b-2, and 34c-2 are disposed in the substrate 31W.

The first electrode pad 33a is electrically connected to the outer electrode 35a through the penetration electrodes 34a-1 and 34a-2. When the upper surface 31A of the base member 30 is viewed in a plan, the penetration electrode 34a-1 is spaced apart from the penetration electrode 34a-2, and the penetration electrodes 34a-1 and 34a-2 are electrically connected to each other through the wiring layer 31C. Similarly, the second electrode pad 33b is electrically connected to the outer electrode 35b through the penetration electrodes 34b-1 and 34b-2, which are spaced apart from each other, and the wiring layer 31C. Similarly, the joint member 50 is electrically connected to the outer electrode 35b through the penetration electrodes 34c-1 and 34c-2, which are spaced apart from each other, and the wiring layer 31C.

As described above, when the base member 30 has a multilayer structure and a wiring layer is disposed between layers, stray capacitance can be adjusted.

As illustrated in FIG. 9, the external substrate 130 has a multilayer structure formed by laminating substrates 131V and 131W formed from an insulating material. The upper surface of the substrate 131V corresponds to the upper surface 131A of the external substrate 130, and the lower surface of the substrate 131W corresponds to the lower surface 131B of the external substrate 130. A wiring layer is disposed on the substrate 131V, and a bump layer is disposed on the wiring layer. The bump layer includes multiple frames formed from an insulating material. The bump layer blocks excessive spreading of the solder portions 153, and reduces failures resulting from a short circuit. When the upper surface 131A of the external substrate 130 is viewed in a plan, multiple frames of the bump layer surround the capacitors 156 and the quartz crystal resonator unit 1.

A metal layer 131C is disposed on the lower surface of the substrate 131V. The metal layer 131C is disposed over substantially the entirety of the lower surface of the substrate 131V. However, the metal layer 131C has multiple slits to prevent the castellation electrode of the external substrate 130 from being short-circuited.

An insulator layer 131D is disposed on the upper surface of the substrate 131W. Multiple terminals are disposed on the lower surface of the substrate 131W.

In such a structure where the external substrate 130 has a multilayer structure and the metal layer is disposed between layers, thermal conductivity between the upper surface 131A and the lower surface 131B of the external substrate 130 is improved.

As described above, in accordance with aspects of the disclosure, the through-hole 20 is formed in the peripheral portion 18 in an area between the first excitation electrode 14a and the first connection electrode 16a, and the internal wall 21 of the through-hole 20 located closer to the first excitation electrode 14a has four slopes.

Thus, the internal wall 21 at least including four slopes attenuates vibration displacement in an area between the exciter 17 and the connectors 19 in a thickness shear vibration mode serving as main vibrations, improves the energy confinement effect, and reduces ESR. As the internal wall 21 is approximate to a convex shape, the thickness bending vibration mode attributable to the contour dimension is prevented, and thus, ESR is reduced. The through-hole 20 reduces stress propagated between the exciter 17 and the connectors 19, and thus reduces vibration leakage or detachment of the quartz crystal resonator 10.

The internal wall 21 of the through-hole 20 located closer to the first excitation electrode 14a is plane-symmetrical with respect to the plane parallel to the main surface of the quartz crystal element 11.

The thickness of the exciter 17 in the quartz crystal element 11 is larger than the thickness of the peripheral portion 18 in the quartz crystal element 11.

This structure can reduce vibration leakage from the exciter 17. In addition, the internal wall 22 can be processed in the process of forming a mesa structure of the exciter 17, and thus the manufacturing process can be simplified.

The angle $\alpha$ of the first slope 21a with respect to the upper surface 18A of the peripheral portion 18 is larger than the angle $\beta$ of the second slope 21c with respect to the upper surface 18A.

Thus, the internal wall 21 is approximate to the convex shape, and thus ESR can be more effectively reduced.

The distance T1 in the thickness direction from the center of the quartz crystal element 11 in the thickness direction to the connection between the first slope 21a and the second slope 21c is larger than the distance T2 in the thickness direction from the connection between the first slope 21a and the second slope 21c to the upper surface 18A of the peripheral portion 18.

Thus, the internal wall 21 is approximate to the convex shape, and ESR can be more effectively reduced.

The angle $\alpha$ and the angle $\beta$ have a relationship of $32° < \alpha < 80°$ and $\beta = 32°$.

Thus, by preferably setting the distance T2, ESR can be reduced further than when $\alpha = \beta = 32°$.

The angle $\alpha$ has a relationship of $40° < \alpha$.

Thus, ESR can be more effectively reduced.

The angle $\alpha$ has a relationship of $\alpha < 65°$.

Thus, ESR can be reduced regardless of when the distance T2 is small.

The distances T2 and T3 have a relationship of $0.56 \leq T2/T3 \leq 0.83$.

Thus, ESR can be more effectively reduced.

The internal wall 22 of the through-hole 20 located closer to the first connection electrode 16a has fewer slopes than the internal wall 21 located closer to the first excitation electrode 14a. The internal wall 22 has two slopes. The angle $\gamma$ of the slopes of the internal wall 22 with respect to the upper surface 18A of the peripheral portion 18 is larger than the angle $\alpha$.

The quartz crystal element 11 needs a space for forming the through-hole 20. Thus, the quartz crystal resonator 10 according to the present aspect has a larger size than a structure not including the through-hole 20. However, forming the internal wall 22 with two slopes can reduce the dimensions of a portion around the connectors 19, and thus can prevent a size increase of the quartz crystal element 11. Particularly, the angle $\gamma$ is larger than the angle $\alpha$, and thus the size increase of the quartz crystal element 11 can be more effectively reduced.

The internal wall 21 protrudes further than the internal wall 22.

Thus, the internal wall 21 is approximate to the convex shape, and thus the thickness bending vibration mode attributable to the contour dimension is prevented, ESR is reduced, and thus the dimensions around the connectors 19 can be reduced. Thus, a size increase of the quartz crystal element 11 can be reduced. The through-hole 20 reduces the stress propagated between the exciter 17 and the connectors 19, and thus can reduce vibration leakage or detachment of the quartz crystal resonator 10.

The thickness of each connector 19 is larger than the thickness of the peripheral portion 18.

This structure improves the bonding strength of the quartz crystal resonator 10 with the electroconductive holding member. Thus, the quartz crystal resonator 10 can stabilize its mount posture, and is thus prevented from being detached. The internal wall 22 can be processed in the process of forming a mesa structure of the connectors 19, and thus the manufacturing process can be simplified.

A structure of a quartz crystal resonator 10 according to another aspect of the present disclosure will be described below. In the following aspects, components the same as those described above will not be described, and only the points different from each other will be described. Particularly, the effects similar to those of the same components will not be described.

Figure 10:
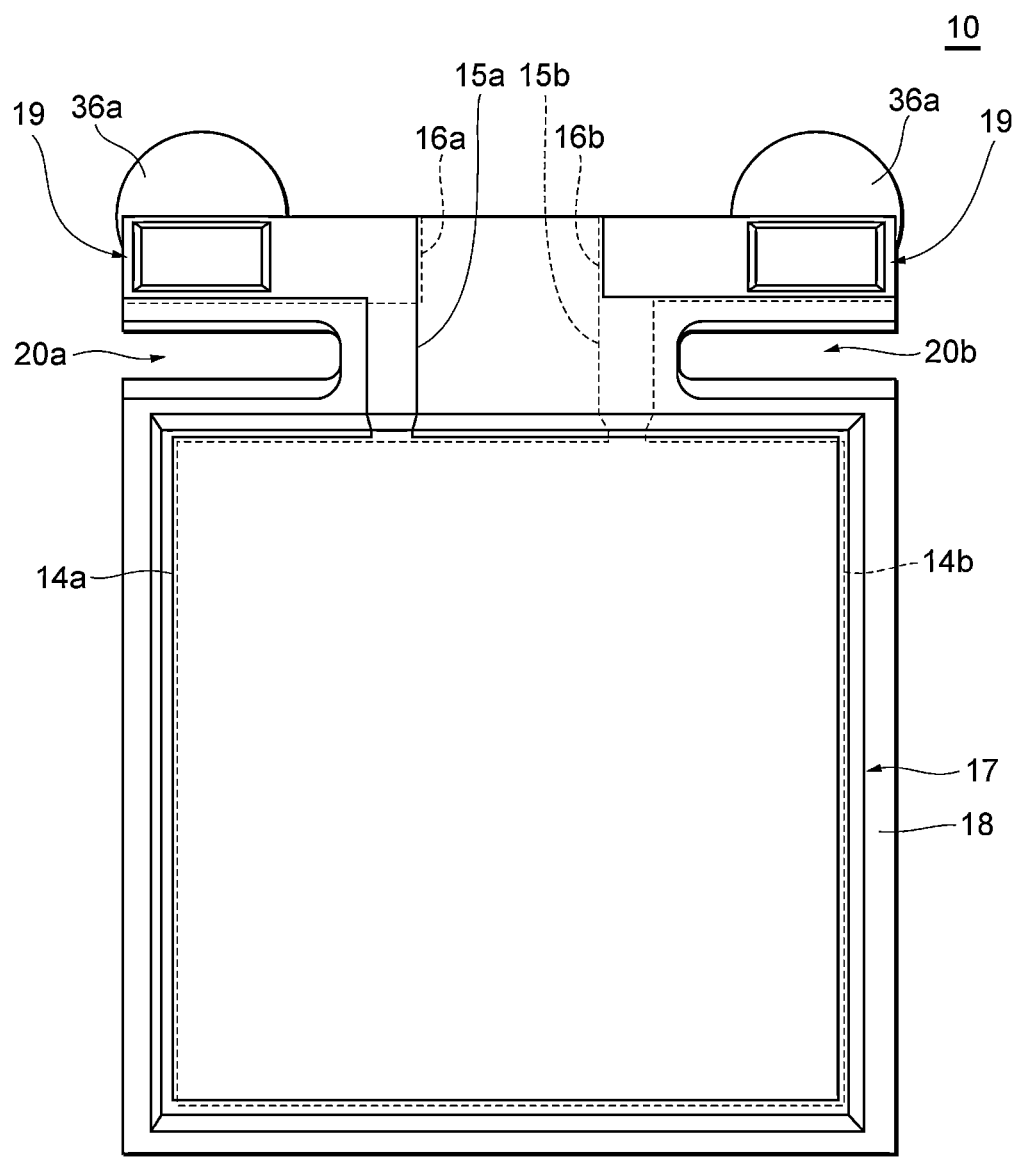
FIG. 10 is a schematic plan view of a structure of a quartz crystal resonator in accordance with aspects of the present disclosure.

With reference to FIG. 10, a structure of the quartz crystal resonator 10 according to an aspect of the disclosure will be described. FIG. 10 is a schematic plan view of a structure of a quartz crystal resonator according to another aspect of the disclosure.

The quartz crystal resonator 10 has two through-holes 20a and 20b. The through-hole 20a is located in the +Z'-axis direction from the through-hole 20b. The through-hole 20a is located in an area between the first excitation electrode 14a and the first connection electrode 16a, and is open in a side surface located in the +Z'-axis direction. The through-hole 20b is located in an area between the second excitation electrode 14b and the second connection electrode 16b, and is open in a side surface located in the −Z'-axis direction.

Figure 11:
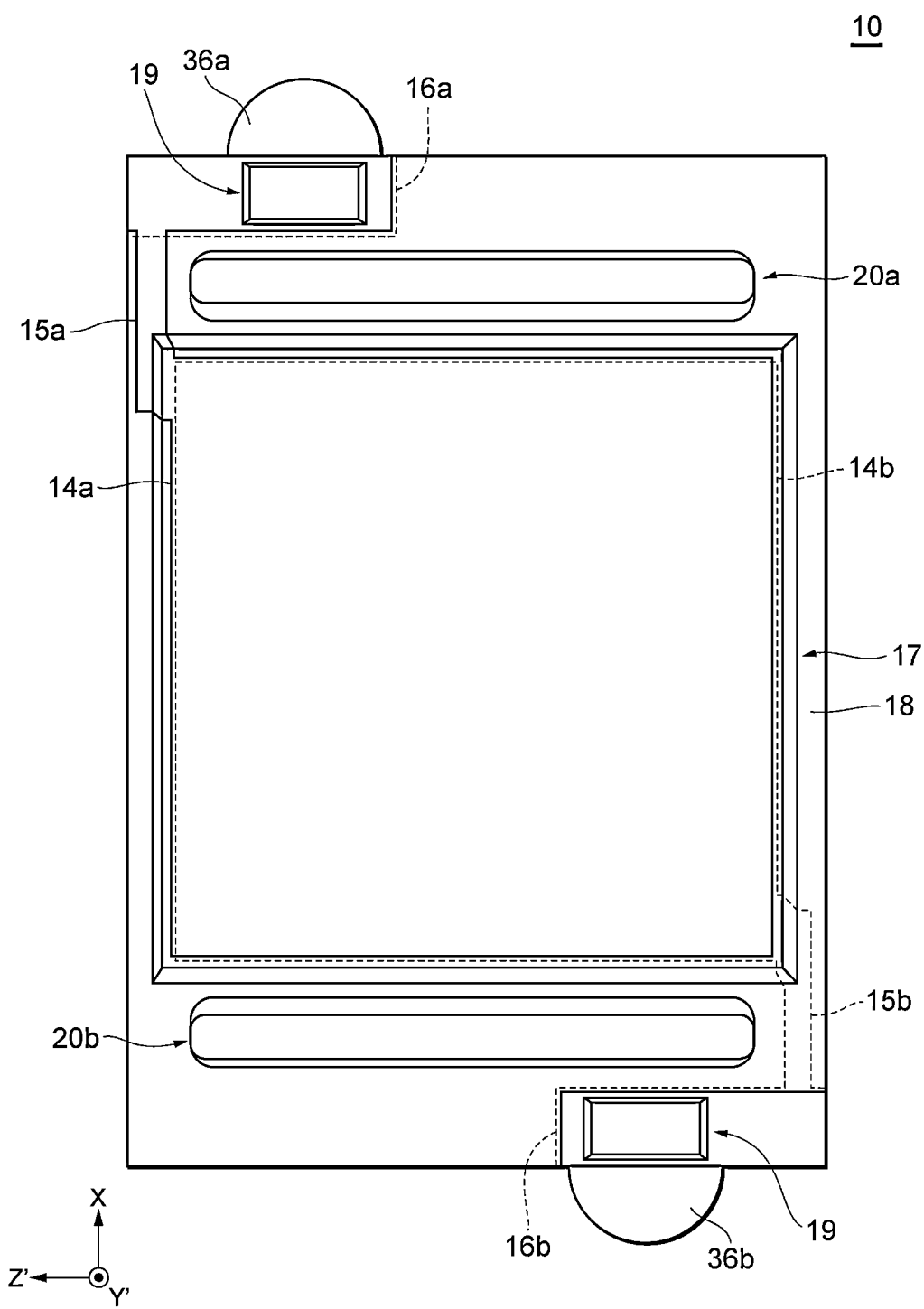
FIG. 11 is a schematic plan view of a structure of a quartz crystal resonator in accordance with aspects of the present disclosure.

With reference to FIG. 11, a structure of the quartz crystal resonator 10 according to another aspect of the disclosure will be described. FIG. 11 is a schematic plan view of a structure of a quartz crystal resonator according to another aspect of the disclosure.

The second connection electrode 16b is located in the −X-axis direction from the second excitation electrode 14b. The quartz crystal resonator 10 has two through-holes 20a and 20b. The through-hole 20a is located in an area between the first excitation electrode 14a and the first connection electrode 16a. The through-hole 20b is located in an area between the second excitation electrode 14b and the second connection electrode 16b.

Figure 12:
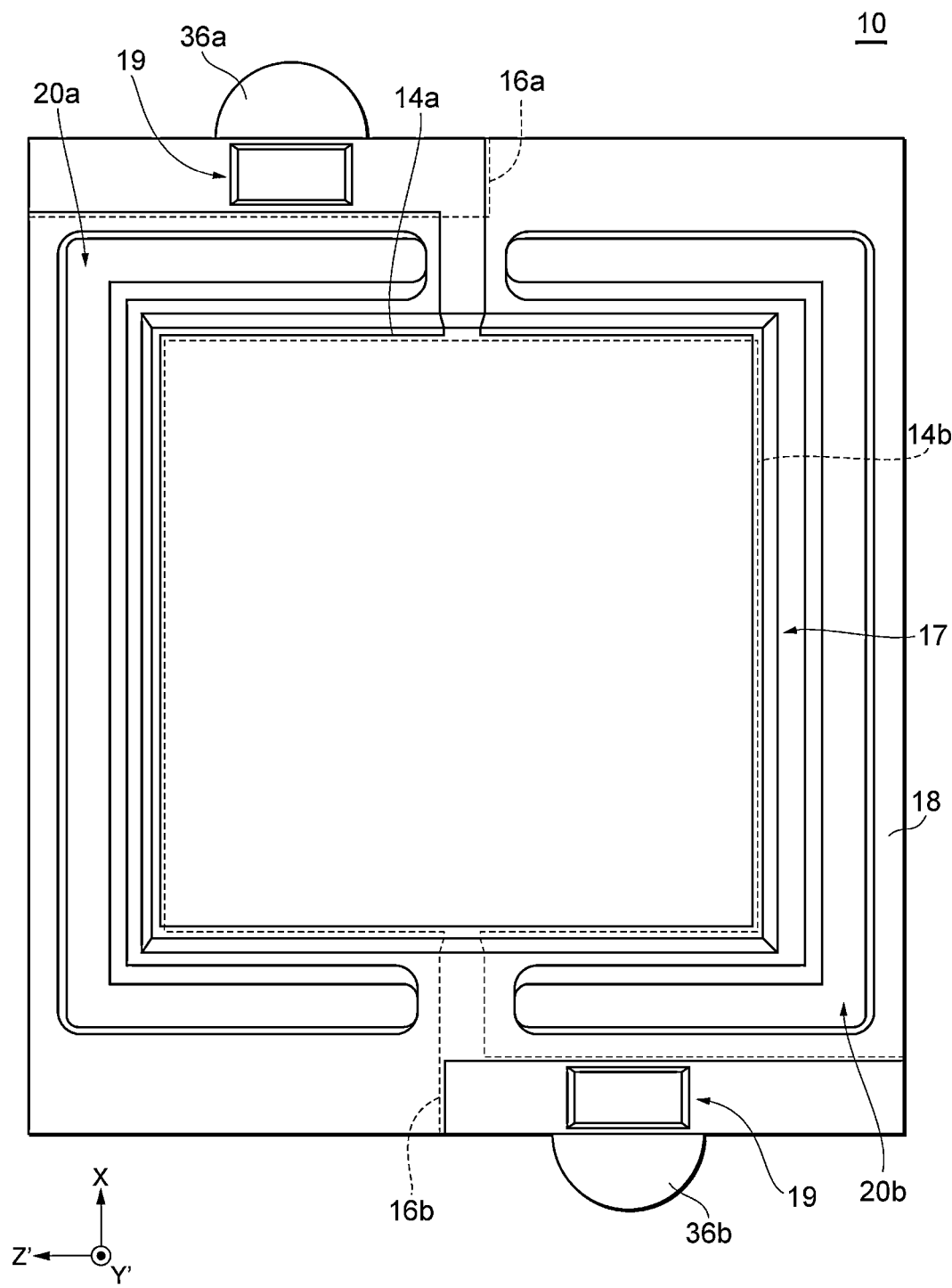
FIG. 12 is a schematic plan view of a structure of a quartz crystal resonator in accordance with aspects of the present disclosure.

With reference to FIG. 12, a structure of the quartz crystal resonator 10 according to another aspect of the disclosure will be described. FIG. 12 is a schematic plan view of a structure of a quartz crystal resonator according to another aspect of the disclosure.

The second connection electrode 16b is located in the −X-axis direction from the second excitation electrode 14b. The quartz crystal resonator 10 has two through-holes 20a and 20b. The through-hole 20a is located in an area between the first excitation electrode 14a and the first connection electrode 16a. The through-hole 20b is located in an area between the second excitation electrode 14b and the second connection electrode 16b. The through-holes 20a and 20b each have a U shape along the outer edge of the exciter 17. Thus, the through-holes 20a and 20b surround the exciter 17 except for a portion where the first extended electrode 15a and the second extended electrode 15b are disposed.

Hereinbelow, aspects of the present disclosure will be partially or fully described supplementarily, and the effects thereof will be described. The present disclosure is not limited to the following supplemental description.

An aspect of the present disclosure provides a quartz crystal resonator that includes a quartz crystal element having a main surface, an excitation electrode disposed on the main surface of the quartz crystal element, and a connection electrode disposed on the main surface of the quartz crystal element and electrically connected to the excitation electrode, wherein when the main surface of the quartz crystal element is viewed in a plan, the quartz crystal element has a through-hole in an area between the excitation electrode and the connection electrode, and an internal wall of the through-hole located closer to the excitation electrode has at least four slopes.

Thus, the internal wall located closer to the excitation electrode includes at least four slopes, attenuates vibration displacement in an area between the excitation electrode and the connection electrode in the thickness shear vibration mode serving as main vibrations, improves the energy confinement effect, and reduces ESR. The internal wall located closer to the excitation electrode and having an approximate convex shape prevents the thickness bending vibration mode attributable to the contour dimension, and reduces ESR. The through-hole reduces stress propagated between the excitation electrode and the connection electrode, and thus reduces vibration leakage or detachment of the quartz crystal resonator.

In one aspect, the internal wall of the through-hole located closer to the excitation electrode is plane-symmetrical with respect to a plane parallel to the main surface of the quartz crystal element.

In one aspect, a thickness of the quartz crystal element at a portion where the excitation electrode is disposed is larger than a thickness of the quartz crystal element in an area between the excitation electrode and the connection electrode.

This structure can reduce vibration leakage from the portion where the excitation electrode is disposed. In addition, the internal wall of the through-hole can be processed in a process of reducing the thickness in the area between the excitation electrode and the connection electrode further than the thickness of the portion where the excitation electrode is disposed. Thus, a manufacturing process can be simplified.

In one aspect, the internal wall of the through-hole located closer to the excitation electrode includes a first slope that is inclined an angle $\alpha$ with respect to a plane parallel to the main surface of the quartz crystal element from substantially a center of the through-hole in the direction in which the through-hole extends, and a second slope that is continuous with the first slope and inclined an angle $\beta$ with respect to the plane parallel to the main surface of the quartz crystal element, and the angle $\alpha$ is larger than the angle $\beta$.

In this structure, the internal wall located closer to the excitation electrode is approximate to the convex shape, and thus ESR is more effectively reduced.

In one aspect, a distance T1 in a direction crossing the main surface of the quartz crystal element from substantially a center of the through-hole to a connection between the first slope and the second slope is smaller than a distance T2 in the direction crossing the main surface of the quartz crystal element from the connection between the first slope and the second slope to a connection between the second slope and the main surface of the quartz crystal element at a portion between the excitation electrode and the connection electrode.

In this structure, the internal wall located closer to the excitation electrode is approximate to the convex shape, and thus ESR is more effectively reduced.

In one aspect, the angle $\alpha$ and the angle $\beta$ have a relationship where $32°<\alpha<80°$ and $\beta=32°$.

In this structure, by preferably setting a distance in a direction crossing the main surface of the quartz crystal element from the connection between the first slope and the second slope to the connection between the second slope and the main surface of the quartz crystal element at a portion between the excitation electrode and the connection electrode, ESR can be reduced further than when $\alpha=\beta=32°$.

In one aspect, the angle $\alpha$ has a relationship of $40°<\alpha$. Thus, ESR can be more effectively reduced.

In one aspect, the angle $\alpha$ has a relationship of $\alpha<65°$.

In this structure, regardless of when a distance in a direction crossing the main surface of the quartz crystal element from the connection between the first slope and the second slope to the connection between the second slope and the main surface of the quartz crystal element at a portion between the excitation electrode and the connection electrode is small, ESR can be reduced.

In one aspect, the distance T2 and the distance T3 have a relationship of $0.56 \leq T2/T3 \leq 0.83$.

In this structure, ESR can be more effectively reduced.

In one aspect, an internal wall of the through-hole located closer to the connection electrode has a slope inclined an angle $\gamma$ with respect to a plane parallel to the main surface of the quartz crystal element from substantially a center of the through-hole in the direction in which the through-hole extends, and the angle $\gamma$ is larger than the angle $\alpha$.

The quartz crystal element needs to have a space for forming the through-hole, and thus the quartz crystal resonator according to the present aspect has a larger size than a structure not including a through-hole. However, the angle $\gamma$ larger than the angle $\alpha$ allows the portion around the connection electrode to have smaller dimensions, and thus the quartz crystal element is prevented from a size increase.

In one aspect, the internal wall of the through-hole located closer to the excitation electrode protrudes further than an internal wall of the through-hole located closer to the connection electrode.

In this structure, the internal wall located closer to the excitation electrode is approximate to a convex shape. Thus, a thickness bending vibration mode attributable to a contour dimension is prevented, ESR is reduced, and the dimensions around the connection electrode can be reduced. Thus, the quartz crystal element is prevented from a size increase.

Another aspect of the present disclosure provides a quartz crystal resonator that includes a quartz crystal element having a main surface, an excitation electrode disposed on the main surface of the quartz crystal element, and a connection electrode disposed on the main surface of the quartz crystal element and electrically connected to the excitation electrode. When the main surface of the quartz crystal element is viewed in a plan, the quartz crystal element has a through-hole in an area between the excitation electrode and the connection electrode, and an internal wall of the through-hole located closer to the excitation electrode protrudes further than an internal wall of the through-hole located closer to the connection electrode.

In this structure, the internal wall located closer to the excitation electrode is approximate to a convex shape. Thus, a thickness bending vibration mode attributable to a contour dimension is prevented, ESR is reduced, and the dimensions around the connection electrode can be reduced. Thus, the quartz crystal element is prevented from a size increase. In addition, the through-hole reduces stress propagated between the excitation electrode and the connection electrode, and thus can reduce vibration leakage or detachment of the quartz crystal resonator.

In one aspect, the quartz crystal element is an AT-cut quartz crystal element.

In one aspect, a thickness of the quartz crystal element at a portion where the connection electrode is disposed is larger than a thickness of the quartz crystal element in an area between the excitation electrode and the connection electrode.

In this structure, the quartz crystal resonator improves its bonding strength to the electroconductive holding member. Thus, the quartz crystal resonator stabilizes its mount posture and is prevented from being detached. The internal wall of the through-hole can be processed in the process of reducing the thickness of the area between the excitation electrode and the connection electrode further than the thickness of the portion where the connection electrode is disposed. Thus, the manufacturing process can be simplified.

In one aspect, a quartz crystal resonator unit includes the quartz crystal resonator, a base member on which the quartz crystal resonator is mounted, a lid member that defines, between the lid member and the base member, an internal space that accommodates the quartz crystal resonator, and a joint member that joins the base member and the lid member to each other.

In one aspect, an electronic device includes the quartz crystal resonator unit and an external substrate on which the quartz crystal resonator is mounted. The external substrate includes a metal layer held between insulator layers.

In this structure, thermal conductivity between an upper surface and a lower surface of the external substrate improves, and thus the temperature of the quartz crystal resonator unit is more easily changeable following an outside temperature.

The aspects of the present disclosure are also applicable to a piezoelectric resonator unit besides a quartz crystal resonator unit. An example of the piezoelectric resonator unit is a quartz crystal resonator unit including a quartz crystal resonator. The quartz crystal resonator uses a quartz crystal element as a piezoelectric piece excited with a piezoelectric effect. However, the piezoelectric piece may be formed from any piezoelectric material such as a piezoelectric single crystal, a piezoelectric ceramic, a piezoelectric thin film, or a piezoelectric polymer coat. Examples of the piezoelectric single crystal include lithium niobate ($LiNbO_3$). Similarly, examples of the piezoelectric ceramic include barium titanate ($BaTiO_3$), lead titanate ($PbTiO_3$), lead zirconate titanate ($Pb(Zr_xTi_{1-x})O_3$, PZT), aluminum nitride (AlN), lithium niobate ($LiNbO_3$), lithium methaniobate ($LiNb_2O_6$), bismuth titanate ($Bi_4Ti_3O_{12}$), lithium tantalate ($LiTaO_3$), lithium tetraborate ($Li_2B_4O_7$), langasite ($La_3Ga_5SiO_{14}$), and tantalum pentoxide ($Ta_2O_5$). Examples of the piezoelectric thin film include a material deposited on, for example, a quartz or sapphire substrate by sputtering the above piezoelectric ceramic. Examples of the piezoelectric polymer coat include polylactic acid (PLA), polyvinylidene fluoride (PVDF), and vinylidene fluoride-triflouroethiene (VDF/TrFE) copolymer. The above piezoelectric materials may be used by being laminated one on top of another, or laminated on another member.

Instead of the above, the aspects of the present disclosure are applicable to any device that performs electromechanical energy conversion with a piezoelectric effect such as a timing device, a sounder, an oscillator, or a load sensor.

As described above, an aspect of the present disclosure can provide a piezoelectric vibration element, a piezoelectric resonator unit, and an electronic device with reduced ESR.

The aspects are described above for ease of understanding the present disclosure, and the present disclosure should not be construed as being limitative. The present disclosure can be changed or improved without departing from the gist of the disclosure, and includes equivalents of those changes or improvements. Specifically, each aspect changed in design as appropriate by a person having ordinary skill in the art is also included in the scope of the present disclosure as long as it has any feature of the present disclosure. For example, components in each aspect, the arrangement, material, conditions, shapes, and size of the components are not limited to those exemplarily described and can be changed as appropriate. The components in each aspect can be combined as long as technically feasible, and these combinations are also included in the scope of the present disclosure as long as they have any feature of the present disclosure.

DESCRIPTION OF REFERENCE SYMBOLS 1 quartz crystal resonator unit
10 quartz crystal resonator
11 quartz crystal element
14a, 14b excitation electrode
15a, 15b extended electrode
16a, 16b connection electrode
17 exciter
18 peripheral portion
19 connector
11A, 17A, 18A, 19A upper surface
11B, 17B, 18B, 19B lower surface
20 through-hole
21, 22 internal wall
21a to 21d, 22a, 22b slope
T1 to T3 distance
α, β, γ angle
W21, W22 width
30 base member
40 lid member
50 joint member
130 external substrate
140 external cap
150 sealing frame
160 IC chip

What is claimed is:

1. A piezoelectric vibration element, comprising:
a piezoelectric piece including a main surface;
an excitation electrode disposed on the main surface of the piezoelectric piece; and
a connection electrode disposed on the main surface of the piezoelectric piece and electrically connected to the excitation electrode,
wherein the piezoelectric piece has a through-hole in an area between the excitation electrode and the connection electrode in a plan view of the main surface of the piezoelectric piece,
wherein an internal wall of the through-hole located closer to the excitation electrode has at least four slopes; and
wherein a thickness of the piezoelectric piece at a portion where the excitation electrode is disposed is larger than a thickness of the piezoelectric piece in an area that includes the through-hole and is between the excitation electrode and the connection electrode.

2. The piezoelectric vibration element according to claim 1, wherein the internal wall of the through-hole closer to the excitation electrode is plane-symmetrical with respect to a plane parallel to the main surface of the piezoelectric piece.

3. The piezoelectric vibration element according to claim 1,
wherein the internal wall of the through-hole located closer to the excitation electrode includes a first slope that is inclined an angle a with respect to a plane parallel to the main surface of the piezoelectric piece from a center of the through-hole in a direction in which the through-hole extends, and a second slope that is continuous with the first slope and inclined an angle β with respect to the plane parallel to the main surface of the piezoelectric piece, and
wherein the angle α is larger than the angle β.

4. The piezoelectric vibration element according to claim 3, wherein a distance T1 in a direction crossing the main surface of the piezoelectric piece from the center of the through-hole to a connection between the first slope and the second slope is smaller than a distance T2 in the direction crossing the main surface of the piezoelectric piece from the connection between the first slope and the second slope to a connection between the second slope and a portion of the main surface of the piezoelectric piece between the excitation electrode and the connection electrode.

5. The piezoelectric vibration element according to claim 4, wherein the angle α and the angle β have a relationship where 32°<α<80° and β=32°.

6. The piezoelectric vibration element according to claim 5, wherein the angle α has a relationship of 40°<α.

7. The piezoelectric vibration element according to claim 5, wherein the angle α has a relationship of α<65°.

8. The piezoelectric vibration element according to claim 5, wherein the distance T2 and a distance T3 have a relationship of 0.56≤T2/T3≤0.83, where the distance T3 is in the direction crossing the main surface of the piezoelectric piece from the center of the through-hole to the connection between the second slope and a portion of the main surface of the piezoelectric piece between the excitation electrode and the connection electrode.

9. The piezoelectric vibration element according to claim 3,
wherein an internal wall of the through-hole located closer to the connection electrode has a slope inclined an angle γ with respect to the plane parallel to the main surface of the piezoelectric piece from the center of the through-hole in the direction in which the through-hole extends, and
wherein the angle γ is larger than the angle a.

10. The piezoelectric vibration element according to claim 1, wherein the internal wall of the through-hole located closer to the excitation electrode protrudes farther than an internal wall of the through-hole located closer to the connection electrode.

11. The piezoelectric vibration element according to claim 1, wherein the piezoelectric piece is a quartz crystal element.

12. The piezoelectric vibration element according to claim 1, wherein a thickness of the piezoelectric piece at a portion where the connection electrode is disposed is larger than a thickness of the piezoelectric piece in an area between the excitation electrode and the connection electrode.

13. A piezoelectric vibration element, comprising:
a piezoelectric piece including a main surface;
an excitation electrode disposed on the main surface of the piezoelectric piece; and
a connection electrode disposed on the main surface of the piezoelectric piece and electrically connected to the excitation electrode,
wherein the piezoelectric piece has a through-hole in an area between the excitation electrode and the connection electrode in a plan view of the main surface of the piezoelectric piece,
wherein an internal wall of the through-hole located closer to the excitation electrode protrudes farther than an internal wall of the through-hole located closer to the connection electrode, and
wherein a thickness of the piezoelectric piece at a portion where the excitation electrode is disposed is larger than a thickness of the piezoelectric piece in an area that includes the through-hole and is between the excitation electrode and the connection electrode.

14. The piezoelectric vibration element according to claim 13, wherein the piezoelectric piece is a quartz crystal element.

15. The piezoelectric vibration element according to claim 14, wherein the quartz crystal element is an AT-cut quartz crystal element.

16. The piezoelectric vibration element according to claim 14, wherein a thickness of the piezoelectric piece at a portion where the connection electrode is disposed is larger than a thickness of the piezoelectric piece in an area between the excitation electrode and the connection electrode.

17. A piezoelectric resonator unit, comprising:
a piezoelectric vibration element, comprising:
- a piezoelectric piece including a main surface;
- an excitation electrode disposed on the main surface of the piezoelectric piece; and
- a connection electrode disposed on the main surface of the piezoelectric piece and electrically connected to the excitation electrode,
- wherein the piezoelectric piece has a through-hole in an area between the excitation electrode and the connection electrode in a plan view of the main surface of the piezoelectric piece;
- wherein a thickness of the piezoelectric piece at a portion where the excitation electrode is disposed is larger than a thickness of the piezoelectric piece in an area that includes the through-hole and is between the excitation electrode and the connection electrode;
- a base member on which the piezoelectric vibration element is mounted;
- a lid member that defines an internal space with the base member that accommodates the piezoelectric vibration element; and
- a joint member that joins the base member to the lid member.

18. An electronic device, comprising:
the piezoelectric resonator unit according to claim 17; and
an external substrate on which the piezoelectric vibration element is mounted,
wherein the external substrate includes a metal layer held between insulator layers.

19. The piezoelectric resonator unit according to claim 17, wherein an internal wall of the through-hole located closer to the excitation electrode has at least four slopes, or protrudes farther than an internal wall of the through-hole located closer to the connection electrode.

* * * * *